(12) United States Patent
Inoue et al.

(10) Patent No.: US 7,615,459 B1
(45) Date of Patent: Nov. 10, 2009

(54) MANUFACTURING METHOD FOR VARIABLE RESISTIVE ELEMENT

(75) Inventors: Yushi Inoue, Fukuyama (JP); Tetsuya Ohnishi, Nara (JP); Kazuya Ishihara, Kurashiki (JP); Takahiro Shibiuya, Fukuyama (JP); Yasunari Hosoi, Fukuyama (JP); Shinobu Yamazaki, Kasaoka (JP); Takashi Nakano, Fukuyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 12/190,398

(22) Filed: Aug. 12, 2008

(51) Int. Cl.
*H01L 21/20* (2006.01)
(52) U.S. Cl. .................................... 438/385
(58) Field of Classification Search ........................ None
See application file for complete search history.

(56) References Cited

U.S. PATENT DOCUMENTS

| | | | |
|---|---|---|---|
| 6,204,139 B1 | 3/2001 | Liu et al. | |
| 6,815,744 B1 | 11/2004 | Beck et al. | |
| 2005/0153504 A1* | 7/2005 | Kawazoe et al. | 438/222 |
| 2006/0281277 A1* | 12/2006 | Tamai et al. | 438/385 |
| 2009/0097300 A1* | 4/2009 | Ishihara et al. | 365/148 |

FOREIGN PATENT DOCUMENTS

JP        2002-537627        11/2002

OTHER PUBLICATIONS

Liu, S.Q. et al., "Electric -pulse-induced reversible resistance change effect in magnetoresistive films," Applied Physics Letter, vol. 76, pp. 2749-2751, 2000.
Baek I. G. et al., "Highly Scalable Non-volatile Resistive Memory using Simple Binary Oxide driven by Asymmetric Unipolar Voltage Pulses," IEDM 04, pp. 587-590, 2004.
H. Pagnia et al., "Bistable Switching in Electroformed Metal-Insulator-Metal Devices," Phys. Stat. Sol. (a), vol. 108, pp. 11-65, in 1988.

* cited by examiner

*Primary Examiner*—Scott B. Geyer
*Assistant Examiner*—Whitney Moore
(74) *Attorney, Agent, or Firm*—Birch, Stewart, Kolasch & Birch, LLP

(57) ABSTRACT

A manufacturing method for a variable resistive element according to which a stable switching operation can be achieved with excellent reproducibility is provided. A conductive thin film is deposited on a semiconductor substrate and patterned to a predetermined form, and after that, a first interlayer insulating film is deposited. An opening is then created in a predetermined location on the first interlayer insulating film in such a manner that the upper surface of the conductive thin film is exposed and the thickness of the conductive thin film formed at the bottom of this opening is reduced through processing, and after that, an oxidation process is carried out on the periphery of the exposed conductive thin film. As a result, a variable resistor film is formed in the peripheral region of the opening, and this variable resistor film divides the conductive thin film into a first electrode and a second electrode.

19 Claims, 30 Drawing Sheets

FIG. 16A
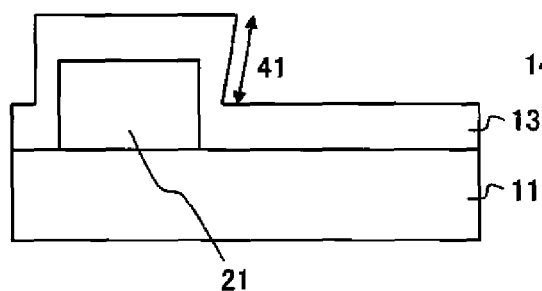
FIG. 16D
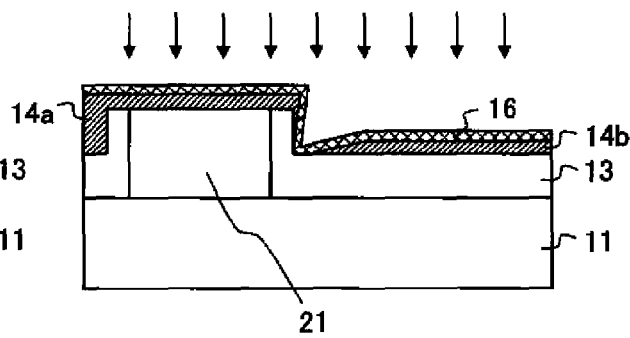
FIG. 16B
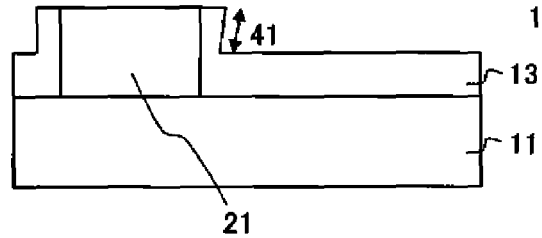
FIG. 16E
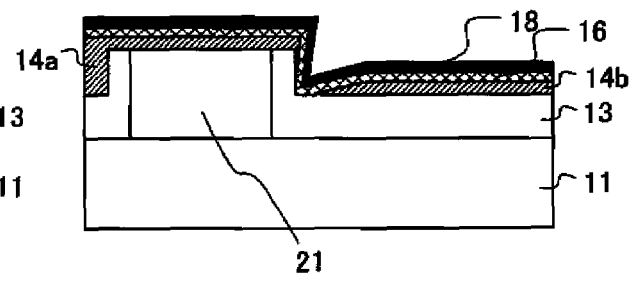
FIG. 16C
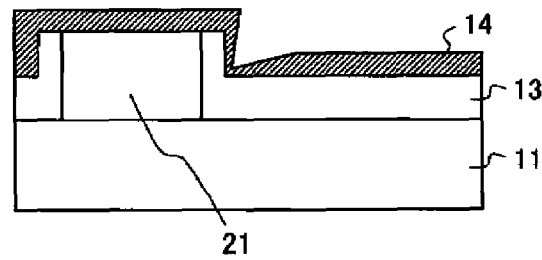
FIG. 16F
FIG. 16G
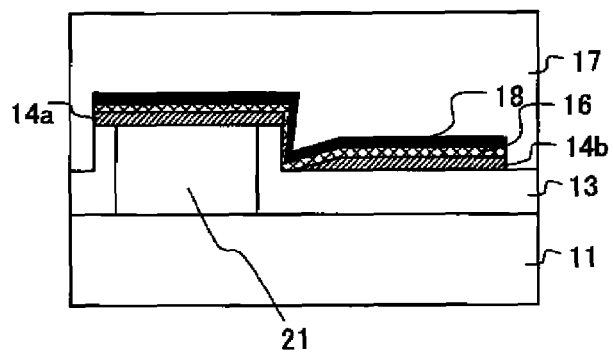

MANUFACTURING METHOD FOR VARIABLE RESISTIVE ELEMENT

BACKGROUND OF THE INVENTION

1. Field of the Invention

The present invention relates to a manufacturing method for a variable resistive element having two electrodes and a variable resistor where the above described variable resistor is in such a region as to be sandwiched between the two electrodes, and the electrical resistance changes when a voltage pulse is applied between the two electrodes.

2. Description of the Related Art

In recent years, various device structures, such as FeRAM's (ferroelectric RAM's), MRAM's (magnetic RAM's) and PRAM's (phase change RAM's) have been proposed as next generation nonvolatile random access memories (NVRAM's), which make fast operation possible and substitute for flash memories, and severe competition in development has led to improvement in the performance, increase in the reliability, reduction in cost and improvement in the integration in the manufacturing process. These memory devices presently have both advantages and shortcomings, and we are far away from being able to implement an ideal "universal memory" having the respective advantages of SRAM's, DRAM's and flash memories.

Using existing technology, resistive nonvolatile memories RRAM (resistive random access memories) having a variable resistive element of which the electrical resistance reversibly changes when a voltage pulse is applied have been proposed. FIG. 26 shows the configuration of such a memory.

As shown in FIG. 26, conventional variable resistive elements have a structure where a lower electrode 103, a variable resistor 102 and an upper electrode 101 are layered in this order, and have such properties that the resistance value can reversibly change when a voltage pulse is applied between the upper electrode 101 and the lower electrode 103. The configuration allows a novel nonvolatile semiconductor memory device to be implemented by reading out the resistance value which changes during the reversible resistance changing operation (hereinafter referred to as "switching operation").

This nonvolatile semiconductor memory device can be provided by forming a memory cell array where a number of memory cells having a variable resistive element are respectively aligned in rows and columns in a matrix, and providing a peripheral circuit for controlling data programming, erasing and reading operations in each memory cell in the memory cell array. In addition, there may be different types of memory cells for this device, depending on the composition, for example memory cells where each memory cell is formed of one selection transistor T and one variable resistance element R (referred to as "1T/1R type") and memory cells where each memory cell is formed of one variable resistive element R (referred to as "1R type"). From among these, an example of the configuration of 1T/1R type memory cells is shown in FIG. 27.

FIG. 27 is an equivalent circuit diagram showing an example of the configuration of a memory cell array made up of 1T/1R type memory cells. The gate of the selection transistor T in each memory cell is connected to a word line (WL1 to WLn), while the source of the selective transistor T in each memory is connected to a source line (SL1 to SLn) (n is a natural number). In addition one electrode of the variable resistive element R in each memory cell is connected to the drain of the selection transistor T and the other electrode of the variable resistive element R is connected to a bit line (BL1 to BLm) (m is a natural number). In addition, the respective word lines WL1 to WLn are connected to a word line decoder 106, the respective source lines SL1 to SLn are connected to a source line decoder 107, and the respective bit lines BL1 to BLm are connected to a bit line decoder 105. Thus, certain bit lines, word lines and source lines are selected for programming, erasing or reading operations in certain memory cells within the memory cell array 104 in response to an address input (not shown) in the configuration.

FIG. 28 is a cross sectional schematic diagram showing one of the memory cells that form the memory cell array 104 in FIG. 27. In the present configuration, each memory cell is formed of a selection transistor T and a variable resistive element R. The selection transistor T is formed of a gate insulating film 113, a gate electrode 114, a drain diffusion layer area 115 and a source diffusion layer area 116 on the upper surface of a semiconductor substrate 111 where an element isolation region 112 is formed. In addition, the variable resistive element R is formed of a lower electrode 118, a variable resistor 119 and an upper electrode 120.

In addition, the gate electrodes 114 of the transistors T form word lines, and the source line wirings 124 are electrically connected to the source diffusion layer areas 116 of the transistors T via contact plugs 122. In addition, the bit line wirings 123 are electrically connected to the upper electrodes 120 of the variable resistive elements R via contact plugs 121, while the lower electrodes 118 of the variable resistive elements R are electrically connected to the drain diffusion layer areas 115 of the transistors T via contact plugs 117.

In this configuration, where the selection transistors T and the variable resistive elements R are aligned in series, the change in potential of the word lines allows the transistors of the selected memory cells to be in an on state, and furthermore, the change in potential of the bit lines allows only the variable resistive elements R of the selected memory cells to be selectively programmed or erased.

FIG. 29 is an equivalent circuit diagram showing an example of the configuration of a 1R type memory cell. Each memory cell is formed of only a variable resistive element R, so that one electrode of the variable resistive element R is connected to a word line (WL1 to WLn) and the other electrode is connected to a bit line (BL1 to BLm). In addition, the respective word lines WL1 to WLn are connected to a word line decoder 133 and the respective bit lines BL1 to BLm are connected to a bit line decoder 132. In addition, certain bit lines and word lines for programming, erasing or reading operations in certain memory cells within the memory cell array 131 are selected in response to an address input (not shown) in the configuration.

FIG. 30 is a schematic perspective diagram showing an example of the structure of a memory cell that forms the memory cell array 131 in FIG. 29. As shown in FIG. 30, an upper electrode wiring 143 and a lower electrode wiring 141 cross each other in the alignment, and one of these forms a bit line and the other forms a word line. In addition, variable resistor 142 is provided where the two electrodes intersect (usually referred to as "cross point") in the structure. Though in the example in FIG. 30, the upper electrode 143 and the variable resistor 142 are processed so as to have the same form for the sake of convenience, the region which electrically contributes to the switching operation of the variable resistor 142 is the cross point where the upper electrode 143 and the lower electrode 141 cross.

Here, the variable resistor material used for the above described variable resistor 119 in FIG. 28 and the variable resistor 142 in FIG. 30 is disclosed by Shangquing Liu and Alex Ignatiev of Houston University in the US, in the specification of U.S. Pat. No. 6,204,139, and by Liu, S. Q. et al. in "Electric-pulse-induced reversible resistance change effect in magnetoresistive films," Applied Physics Letter, Vol. 76, pp. 2749-2751, in 2000, which describe a method for reversibly changing the electrical resistance by applying a voltage pulse to a perovskite material which is known to have colossal magnet resistance effects. This method is state-of-the-art in that use of a perovskite material which is known to have colossal magnet resistance effects causes change of several digits in the resistance at room temperature without application of a magnetic field. Here, the element structure described in the specification of U.S. Pat. No. 6,204,139 uses a crystal praseodymium calcium manganese oxide $Pr_{1-x}Ca_xMnO_3$ (PCMO) film, which is a perovskite-type oxide, as the material for the variable resistor.

As for other variable resistor materials, it is known from H. Pagnia et al., "Bistable Switching in Electroformed Metal-Insulator-Metal Devices," Phys. Stat. Sol. (a), vol. 108, pp. 11-65, in 1988, and Japanese Translation of International Unexamined Patent Publication No. 2002-537627 and the like that oxides of transition metal elements, such as titanium oxide ($TiO_2$) films, nickel oxide (NiO) films, zinc oxide (ZnO) films and niobium oxide ($Nb_2O_5$) films exhibit reversible change in the resistance. From among these, switching operation using NiO is reported in detail in Baek I. G. et al., "Highly Scalable Non-volatile Resistive Memory Using Simple Binary Oxide Driven by Asymmetric Unipolar Voltage Pulses," IEDM 04, pp. 587-590, in 2004.

According to the above described prior art, variable resistive elements R are formed by layering a lower electrode, a variable resistor and an upper electrode on a substrate in this order. Therefore, in order to gain variable resistive elements having a stable switching operation with excellent reproducibility, it is essential for the contact resistance between the lower electrode and the variable resistor and the contact resistance between the variable resistor and the upper electrode to be consistent among memory cells within the same wafer, as well as among the wafers.

In accordance with conventional methods, however, the surface of the electrodes and the variable resistor is exposed to gases and chemicals used in the process, therefore, it cannot be said that the surface is always clean. In addition, a problem arises, such that the contact resistance is not stable, due to the effects of natural oxidation after the film formation of the lower electrodes and variable resistors, and the effects of the atmosphere on the process for film formation for the films deposited in upper layers.

SUMMARY OF THE INVENTION

The present invention is provided in view of the above described problems, and an object thereof is to provide a manufacturing method for a variable resistive element having a stable switching operation with excellent reproducibility.

In order to achieve the above described object, the manufacturing method for a variable resistive element according to the present invention is a manufacturing method for a variable resistive element having a first electrode, a second electrode and a variable resistor sandwiched between the first electrode and the second electrode, in which the electrical resistance between the first electrode and the second electrode changes when a voltage pulse is applied between the first electrode and the second electrode, and the method is characterized as a first aspect by comprising steps of: depositing one conductive film as a precursor of the first electrode, the second electrode and the variable resistor; and converting a portion of the conductive film to the variable resistor so that the remaining portion of the conductive film is divided into the first electrode and the second electrode by the variable resistor.

In accordance with the manufacturing method for a variable resistive element according to the first aspect of the present invention as described above, the first and second electrodes and the variable resistor which form the variable resistive element are all originally made from the same conductive film, and a portion of the conductive film is converted to the variable resistor so that the first and second electrodes are formed when the conductive film is divided by this variable resistor. Accordingly, unlike conventional manufacturing methods for forming one electrode by depositing a conductive film after the formation of a variable resistor, the interfaces between the variable resistor and the electrodes (two electrodes, first and second) are not exposed to an atmosphere for the film formation atmosphere or air. Thus, the contact resistance does not become inconsistent as a result of the attachment of particles or the like to the interfaces in order for the contact resistance to be stabilized among the memory cells in the same wafer as well as among different wafers. Accordingly, the voltage applied across the two ends of a variable resistor can be made uniform, and thus, a variable resistive element having a stable switching operation with excellent reproducibility can be formed.

In addition to the above described first aspect, the manufacturing method for a variable resistive element according to a second aspect of the present invention is characterized by comprising steps of: depositing the conductive film on a semiconductor substrate; oxidizing the conductive film to convert a portion of the conductive film to the variable resistor; and depositing a protective interlayer insulating film over the entire surface after oxidizing the conductive film.

In accordance with the manufacturing method for a variable resistive element according to the second aspect of the present invention, the variable resistor and the first and second electrodes can be made from one conductive film without exposing the interfaces between the variable resistor and the two electrodes to an atmosphere for the film formation or air.

In addition to the above described second aspect, the manufacturing method for a variable resistive element according to a third aspect of the present invention is characterized by comprising, after depositing the conductive film and before oxidizing the conductive film, steps of depositing a first interlayer insulating film so that the upper surface of the conductive film is covered; and creating an opening in a portion of the first interlayer insulating film so that a portion of the upper surface of the conductive film is exposed after depositing the first interlayer insulating film, wherein a peripheral region of the conductive film exposed via the opening is oxidized through the step of oxidizing the conductive film.

In accordance with the manufacturing method for a variable resistive element according to the above described third aspect of the present invention, oxidation progresses starting from the conductive film exposed via the opening, and the oxidized portion is converted to a variable resistor, and thus, the originally integrated conductive film can be changed to have a configuration where the variable resistor formed in the periphery of the opening is sandwiched between the first and second electrodes on both sides, and as a result, a variable resistive element can be manufactured without exposing the interfaces between the variable resistor and the two electrodes.

In addition to the above described third aspect, the manufacturing method for a variable resistive element according to a fourth aspect of the present invention is characterized by comprising a step of reducing the thickness of the conductive film located at the bottom of the opening by partially removing the exposed portion of the conductive film exposed via the opening, after creating the opening and before oxidizing the conductive film.

In accordance with the manufacturing method for a variable resistive element according to the above described fourth aspect of the present invention, the film thickness at the bottom of the opening is reduced, therefore, an oxidation process can be easily carried out on the conductive film formed at the bottom of the opening throughout the entire thickness, which has been reduced in the step of oxidizing the conductive film. As a result, the conductive film is divided by the variable resistor formed during the oxidation process, and consequently, a variable resistive element where a variable resistor is sandwiched between the first and second electrodes can be easily manufactured without exposing the interfaces between the variable resistor and the two electrodes.

In addition to the above described second aspect, the manufacturing method for a variable resistive element according to a fifth aspect of the present invention is characterized by comprising steps of depositing a first interlayer insulating film on the semiconductor substrate, and creating at least two separate openings in a predetermined region of the first interlayer insulating film, before depositing the conductive film; and reducing the thickness of the conductive film so that the conductive film deposited in the region other than the openings is not completely removed after depositing the conductive film and before oxidizing the conductive film, and is also characterized in that the step of depositing the conductive film is carried out so that the two openings are completely filled with the conductive film, and the step of oxidizing the conductive film is a step of forming the variable resistor by oxidizing the conductive film by a thickness which is not less than the thickness of the conductive film deposited in the region other than the openings and which is less than the thickness of the conductive film deposited from the upper surface of the conductive film to the bottom of the openings.

In accordance with the manufacturing method for a variable resistive element according to the above described fifth aspect of the present invention, the film thickness of the conductive film formed in a layer above the bottom of the openings is greater than the film thickness of the conductive film deposited in the region other than the openings in the configuration, therefore, an unoxidized conductive film corresponding to the depth of the opening remains in the openings, even in a state where the conductive film deposited in the region other than the openings is completely oxidized throughout the thickness by oxidizing the conductive film starting from the exposed surface in the step of oxidizing the conductive film. That is to say, the step of oxidizing the conductive film is carried out under such conditions that the conductive film deposited in the region other than the openings is completely oxidized, and at the same time, an unoxidized conductive film remains within the openings, and thus, one conductive film can be divided into two conductive films (electrodes) which remain in the openings and a variable resistor. As a result, a variable resistor element can be manufactured without exposing the interfaces between the variable resistor and the respective electrodes to an atmosphere of film formation or air.

In addition to the above described second aspect, the manufacturing method for a variable resistive element according to a sixth aspect of the present invention is characterized by comprising carrying out a predetermined conductive film pre-depositing process on a layer under the conductive film in advance before depositing the conductive film so that the conductive film deposited in the step of depositing the conductive film has a locally thin film region having a film thickness smaller than that of the other portion.

In accordance with the manufacturing method for a variable resistive element according to the above described sixth aspect of the present invention, the step of depositing the conductive film is carried out after the conductive film pre-depositing process is carried out, therefore, a locally thin film region where the film thickness is thinner than the other portion is formed in a portion of the conductive film after the step of depositing the conductive film. Accordingly, in the step of oxidizing the conductive film, the locally thin film region is converted to a variable resistor by oxidizing the locally thin film region throughout the thickness, and thus, one conductive film deposited in the step of depositing the conductive film can be divided into two conductive regions (electrodes) by the variable resistor. As a result, a variable resistive element can be manufactured without exposing the interfaces between the variable resistor and the electrodes to an atmosphere of film formation or air.

In addition to the above described sixth aspect, the manufacturing method for a variable resistive element according to a seventh aspect of the present invention is characterized in that the step of carrying out the conductive film pre-depositing process includes steps of depositing a first interlayer insulating film on the semiconductor substrate; and creating an opening in tapered form so that the area of the opening becomes smaller toward the lower direction in a predetermined region of the first interlayer insulating film, and the step of depositing the conductive film is carried out over the entire surface so that the opening is not completely filled with the conductive film and the locally thin film region is formed in at least a portion of the sidewall inside the opening, and the step of oxidizing the conductive film is a step of forming the variable resistor by oxidizing the conductive film from the exposed surface side, and forming the first electrode and the second electrode by oxidizing at least the locally thin film region to divide the conductive film into the conductive film formed on the bottom side of the opening and the conductive film formed in the region above the locally thin film region by the locally thin film region which is oxidized and converted into the variable resistor.

In accordance with the manufacturing method for a variable resistive element according to the above described seventh aspect of the present invention, the opening is made into a tapered form before the deposition of the conductive film, therefore, the conductive film deposited in the step of depositing the conductive film forms a locally thin film region in an inclined portion of the sidewall inside the opening. Accordingly, the locally thin film region is oxidized throughout its film thickness so as to be converted to a variable resistor in the step of oxidizing the conductive film, and thus, one conductive film deposited in the step of depositing the conductive film can be divided into two conductive regions (electrodes) by the variable resistor. As a result, a variable resistive element can be manufactured without exposing the interfaces between the variable resistor and the electrodes to an atmosphere of film formation or air.

In addition to the above described sixth aspect, the manufacturing method for a variable resistive element according to an eighth aspect of the present invention is characterized in that the step of carrying out the conductive film pre-depositing process includes steps of: depositing a first interlayer insulating film on the semiconductor substrate; creating an opening in a predetermined region of the first interlayer insulating film; and forming a sidewall insulating film having a width increasing toward the lower direction on the sidewall surface of the opening, and the step of depositing the conductive layer is carried out over the entire surface so that the opening is not completely filled with the conductive layer and the locally thin film region is formed in at least a portion of the sidewall outside the sidewall insulating film, and the step of oxidizing the conductive film is a step of forming the variable resistor by oxidizing the conductive film from the exposed surface side, and forming the first electrode and the second electrode by oxidizing at least the locally thin film region to divide the conductive film into the conductive film formed on the bottom side of the opening and the conductive film formed in the region above the locally thin film region by the locally thin film region which is oxidized and converted into the variable resistor.

In accordance with the manufacturing method for a variable resistive element according to the above described eighth aspect of the present invention, a sidewall insulating film whose width increases toward the lower direction is formed on the sidewall surface of the opening before the deposition of the conductive film, therefore, the conductive film deposited in the step of depositing the conductive film forms a locally thin film region in an inclined portion of the sidewall outside the sidewall insulating film. Accordingly, in the step of oxidizing the conductive film, the locally thin film region is oxidized throughout its film thickness so as to be converted to a variable resistor, and thus, one conductive film deposited in the step of depositing the conductive film can be divided into two conductive regions (electrodes) by the variable resistor. As a result, a variable resistive element can be manufactured without exposing the interfaces between the variable resistor and the electrodes to an atmosphere of film formation or air.

In addition to the above described sixth aspect, the manufacturing method for a variable resistive element according to a ninth aspect of the present invention is characterized in that the step of carrying out a conductive film pre-depositing process includes a step of depositing a first interlayer insulating film, having a step portion where there is a difference in height between the adjoining portions of the upper surface, on the semiconductor substrate, and the step of depositing the conductive film is a step of forming the conductive film having the locally thin film region by depositing the conductive film over an entire surface including the step portion, the locally thin film region having a film thickness decreasing toward a corner portion which is a intersection between a sidewall portion and the lower upper surface, the sidewall portion connecting the higher upper surface and the lower upper surface constituting the step portion, and the step of oxidizing the conductive film is a step of forming the variable resistor by oxidizing the conductive film from the exposed surface side, and forming the first electrode and the second electrode by oxidizing at least the locally thin film region to divide the conductive film into the conductive film deposited on the higher upper surface and the conductive film deposited on the lower upper surface by the locally thin film region which is oxidized and converted into the variable resistor.

In accordance with the manufacturing method for a variable resistive element according to the above described ninth aspect of the present invention, the first interlayer insulating film having a step portion where there is a difference in height between adjacent portions of the upper surface is formed before the deposition of the conductive film, therefore, the conductive film deposited in the step of depositing the conductive film has a locally thin film region in the step portion of the first interlayer insulating film in such a form that the film thickness is thinner toward the corner portion which is an intersection between the sidewall portion for connecting the higher upper surface and the lower upper surface constituting the step portion and the lower upper surface. Accordingly, in the step of oxidizing the conductive film, the locally thin film region is oxidized throughout the film thickness of the locally thin film region so as to be converted to a variable resistor, and thus, one conductive film deposited in the step of depositing the conductive film can be divided into two conductive regions (electrodes) by the variable resistor. As a result, a variable resistive element can be manufactured without exposing the interfaces between the variable resistor and the electrodes to an atmosphere of film formation or air.

Here, at this time, the first interlayer insulating film is deposited on the base layer where the step portion is formed in advance so that a step portion can be provided to the first interlayer insulating film. In this case, it is appropriate to carry out the step of depositing the first interlayer insulating film using a plasma CVD method having poor step coating properties. As a result, it becomes easy to form the first interlayer insulating film in such a form that the film protrudes more to the outside toward the higher upper surface from the lower upper surface in the step region.

In addition to the above described sixth aspect, the manufacturing method for a variable resistive element according to a tenth aspect of the present invention is characterized in that the step of carrying out a conductive film pre-depositing process includes steps of: depositing a first interlayer insulating film having a film density becoming higher toward the upper layer; and patterning the first interlayer insulating film to form a step portion where there is a difference in height between the adjacent portions of the upper surface by removing the first interlayer insulating film other than a predetermined region and to make a sidewall portion for connecting the higher upper surface and the lower upper surface constituting the step portion have a reverse tapered form where the first interlayer insulating film protrudes more to the outside toward the upper layer, and the step of depositing the conductive film is a step of forming the conductive film having the locally thin film region in wedge form by depositing the conductive film over the entire surface including the step portion, the locally thin film region having a film thickness decreasing toward a corner portion where the sidewall portion and the lower upper surface intersect, and the step of oxidizing the conductive film is a step of forming the variable resistor by oxidizing the conductive film from the exposed surface side, and forming the first electrode and the second electrode by oxidizing at least the locally thin film region to divide the conductive film into the conductive film deposited on the higher upper surface and the conductive film deposited on the lower upper surface by the locally thin film region which is oxidized and converted into the variable resistor.

In accordance with the manufacturing method for a variable resistive element according to the above described tenth aspect of the present invention, the first interlayer insulating film is formed in such a manner that the film density becomes higher toward the upper layer before the deposition of the conductive film, and the step portion in reverse tapered form which protrudes more to the outside toward the upper layer is formed in the step of patterning the first interlayer insulating film, therefore, the conductive film deposited in the step of depositing the conductive film forms the locally thin film region in the step portion of this first interlayer insulating film in such a form that the film thickness becomes smaller toward the corner portion which is an intersection between the sidewall portion for connecting the higher upper surface and the lower upper surface constituting the step portion and the lower upper surface. Accordingly, in the step of oxidizing the conductive film, the locally thin film region is oxidized throughout the film thickness of the locally thin film region so as to be converted to a variable resistor, and thus, one conductive film deposited in the step of depositing the conductive film can be divided into two conductive regions (electrodes) by the variable resistor. As a result, a variable resistive element can be manufactured without exposing the interfaces between the variable resistor and the electrodes to an atmosphere of film formation or air.

In addition to the above described tenth aspect, the manufacturing method for a variable resistive element according to an eleventh aspect of the present invention is characterized in that the step of depositing the first interlayer insulating film is carried out by increasing the temperature of the substrate continuously or intermittently.

In accordance with the manufacturing method for a variable resistive element according to the above described eleventh aspect of the present invention, the first interlayer insulating film of which the film density is higher toward the upper layer can be formed in the step of depositing the first interlayer insulating film.

In addition to the above described tenth or eleventh aspect, the manufacturing method for a variable resistive element according to a twelfth aspect of the present invention is characterized in that the step of patterning the first interlayer insulating film is carried out through wet etching.

In accordance with the manufacturing method for a variable resistive element according to the above described twelfth aspect of the present invention, the first interlayer insulating film is removed more through etching toward the lower layer where the film density is lower than the upper layer having a high film density, and as a result, a step portion in reverse tapered form where the film protrudes more to the outside toward the upper layer can be formed.

In addition to the above described sixth aspect, the manufacturing method for a variable resistive element according to a thirteenth aspect of the present invention is characterized in that the step of carrying out the conductive film pre-depositing process includes steps of depositing a first interlayer insulating film on the semiconductor substrate; depositing a second interlayer insulating film having an etching rate lower than that of the first interlayer insulating film on the upper surface of the first interlayer insulating film, and patterning the first and second interlayer insulating films to form a step portion where there is a difference in height between the adjacent portions of the upper surface by removing the first and second interlayer insulating films other than a predetermined region and to make a sidewall portion for connecting the higher upper surface and the lower upper surface constituting the step portion have a reverse step form where the region formed of the second interlayer insulating film protrudes more to the outside than the region formed of the first interlayer insulating film, the step of depositing the conductive film is a step of forming the conductive film having the locally thin film region in wedge form by depositing the conductive film over the entire surface including the step portion, the locally thin film region having a film thickness decreasing toward a corner portion where the sidewall portion and the lower upper surface intersect, and the step of oxidizing the conductive film is a step of forming the variable resistor by oxidizing the conductive film from the exposed surface side, and forming the first electrode and the second electrode by oxidizing at least the locally thin film region to divide the conductive film into the conductive film deposited on the higher upper surface and the conductive film deposited on the lower upper surface by the locally thin film region which is oxidized and converted into the variable resistor.

In accordance with the manufacturing method for a variable resistive element according to the above described thirteenth aspect of the present invention, the first interlayer insulating film and the second interlayer insulating film of which the etching rate is lower than that of the first interlayer insulating film are deposited before the deposition of the conductive film, and at the same time, the first interlayer insulating film in a lower layer is removed through etching more than the second interlayer insulating film in an upper layer in the step of patterning the first and second interlayer insulating films, and as a result, a step portion in reverse step form where the second interlayer insulating film, which is an upper layer, protrudes more to the outside is formed. Thus, the conductive film is deposited after the formation of this step portion, so that the conductive film can be formed in such a manner that the thickness of the film deposited outside the lower layer portion (sidewall of the first interlayer insulating film) is smaller than the thickness of the film deposited on the outside of the upper layer portion (sidewall of the second interlayer insulating film) in the step portion, and as a result, the locally thin film region can be formed on the sidewall outside the first interlayer insulating film. Accordingly, in the step of oxidizing the conductive film, the locally thin film region is oxidized throughout the film thickness of the locally thin film region so as to be converted to a variable resistor, and thus, one conductive film deposited in the step of depositing the conductive film can be divided into two conductive regions (electrodes) by the variable resistor. As a result, a variable resistive element can be manufactured without exposing the interfaces between the variable resistor and the electrodes to an atmosphere of film formation or air.

In addition to the above described thirteenth aspect, the manufacturing method for a variable resistive element according to a fourteenth aspect of the present invention is characterized in that the step of depositing the first interlayer insulating film is a step of depositing an $SiO_2$ film, the step of depositing the second interlayer insulating film is a step of depositing an SiN film, and the step of patterning the first and second interlayer insulating films is carried out through wet etching using an HF chemical.

In accordance with the manufacturing method for a variable resistive element according to the above described fourteenth aspect of the present invention, the wet etching rate of the SiN film with HF is lower than that of the $SiO_2$ film, therefore, a step portion in reverse step form where the SiN film in an upper layer protrudes more to the outside than the $SiO_2$ film in a lower layer can be formed in the step of patterning the first and second interlayer insulating films.

In addition to any of the above described sixth to fourteenth aspects, the manufacturing method for a variable resistive element according to a fifteenth aspect of the present invention is characterized by comprising steps of: depositing an oxidation preventing insulating film so that the upper surface of the variable resistor is covered after oxidizing the conductive film, and patterning the oxidation preventing insulating film, the variable resistor and the conductive film after depositing the oxidation preventing insulating film.

In accordance with the manufacturing method for a variable resistive element according to the above described fifteenth aspect of the present invention, the variable resistor can be prevented from being affected by the oxidation in a resist ashing process or the like when the patterning process is carried out on the variable resistor, and thus, a variable resistive element can be manufactured without deteriorating the properties of the variable resistor.

In addition to the above described fifteenth aspect, the manufacturing method for a variable resistive element according to a sixteenth aspect of the present invention, is characterized in that the oxidation preventing insulating film is an insulating film which includes nitrogen or carbon.

In accordance with the manufacturing method for a variable resistive element according to the above described sixteenth aspect of the present invention, the first and second electrodes and the variable resistor can be prevented from being affected by the oxidation after patterning, and thus, the variable resistive element can be manufactured without deteriorating the properties of the variable resistor.

In addition to any of the above described sixth to sixteenth aspects, the manufacturing method for a variable resistive element according to a seventeenth aspect of the present invention is characterized in that the step of depositing the conductive film is carried out by using a directional sputtering film formation method.

In addition to any of the above described sixth to sixteenth aspects, the manufacturing method for a variable resistive element according to an eighteenth aspect of the present invention is characterized in that the step of depositing the conductive film is carried out by layering films formed by a CVD method and formed by sputtering.

In accordance with the manufacturing method for a variable resistive element according to the above described seventeenth or eighteenth aspect of the present invention, there is a difference between the film thickness of the conductive film deposited on the sidewall in the step portion and the film thickness of the conductive film deposited on the first interlayer insulating film so that the film thickness in the locally thin film region can be made sufficiently small in comparison with the other regions. Accordingly, the conductive film can be easily divided into two regions (first electrode and second electrode) by the variable resistor formed in the locally thin film region in the step of oxidizing the conductive film.

In addition to any of the above described first to eighteenth aspects, the manufacturing method for a variable resistive element according to a nineteenth aspect of the present invention is characterized in that the conductive film is titanium nitride.

In accordance with the manufacturing method for a variable resistive element according to the above described nineteenth aspect of the present invention, a variable resistor can be formed of titanium nitride oxide or titanium oxide so that the properties thereof allow the resistance value to be varied depending on the applied voltage in the step of oxidizing the conductive film, therefore, a variable resistive element having first and second electrodes made of titanium nitride and a variable resistor made of titanium oxide or titanium nitride oxide sandwiched between the two electrodes and exhibiting stable switching properties can be implemented.

Here, the conductive film may be formed of a transition metal, such as Cu, Ni, V, Zn, Nb, Ti, W, and Co, or a nitride of these transition metals in addition to titanium nitride. In this case, the variable resistor is formed of a metal oxide or a metal nitride oxide which is generated when the transition metal or the nitride of the transition metal which is used is oxidized.

In the configuration of the present invention, the interface between the variable resistor and the first electrode as well as the interface between the variable resistor and the second electrode is not exposed to air or an atmosphere of the film formation, therefore, no particles or natural oxides adhere to these interfaces in the manufacturing process, and thus, the contact resistance is stabilized. As a result, the contact resistance is stabilized among memory cells within the same wafer or among different wafers, and it becomes possible to implement a non-volatile semiconductor memory device exhibiting stable switching properties.

BRIEF DESCRIPTION OF THE DRAWINGS

FIGS. 16A to 16G are cross sectional diagrams schematically illustrating the manufacturing steps in the manufacturing method for a variable resistive element according to another version of the fifth embodiment of the present invention;

DETAILED DESCRIPTION OF THE INVENTION

In the following, the manufacturing methods for a variable resistive element according to the embodiments of the present invention (each of which is hereinafter referred to as "method of the present invention") are described in reference to the drawings. Here, a variable resistive element manufactured according to a method of the present invention is formed so as to have two electrodes (hereinafter referred to as "first electrode" and "second electrode," respectively) and a variable resistor sandwiched between these two electrodes. In addition, the resistance value is reversibly changed when a voltage pulse is applied between the first electrode and the second electrode, and the resistance value of the variable resistive element after the change is read out so that the state of memory (programmed state or erased state) which relates to the read out resistance value can be recognized.

FIRST EMBODIMENT

The first embodiment of the method of the present invention (hereinafter referred to as "present embodiment") is described in reference to FIGS. 1A to 1G and FIG. 2. FIGS. 1A to 1G are cross sectional diagrams schematically illustrating the steps for the manufacture of a semiconductor device according to the present embodiment, respectively. In addition, FIG. 2 is a flow chart illustrating the manufacturing steps in the present embodiment, and each step in the following corresponds to a step in the flow chart of FIG. 2.

Here, the schematic cross sectional diagrams of FIGS. 1A to 1G and other schematic structural diagrams which are referred to for the description of the present and following respective embodiments are shown solely for the purpose of illustration, and thus, the scale of the dimensions of the actual structure and that of the drawings do not necessarily coincide. In addition, the numerical values of the film thickness of the respective films deposited in the respective steps are merely examples and the invention is not limited to these values. This is the same in the respective following embodiments.

Figure 1A:
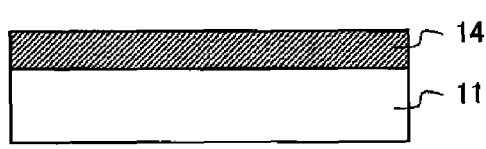
FIGS. 1A to 1G are cross sectional diagrams schematically illustrating the manufacturing steps in the manufacturing method for a variable resistive element according to the first embodiment of the present invention.
Figure 2:
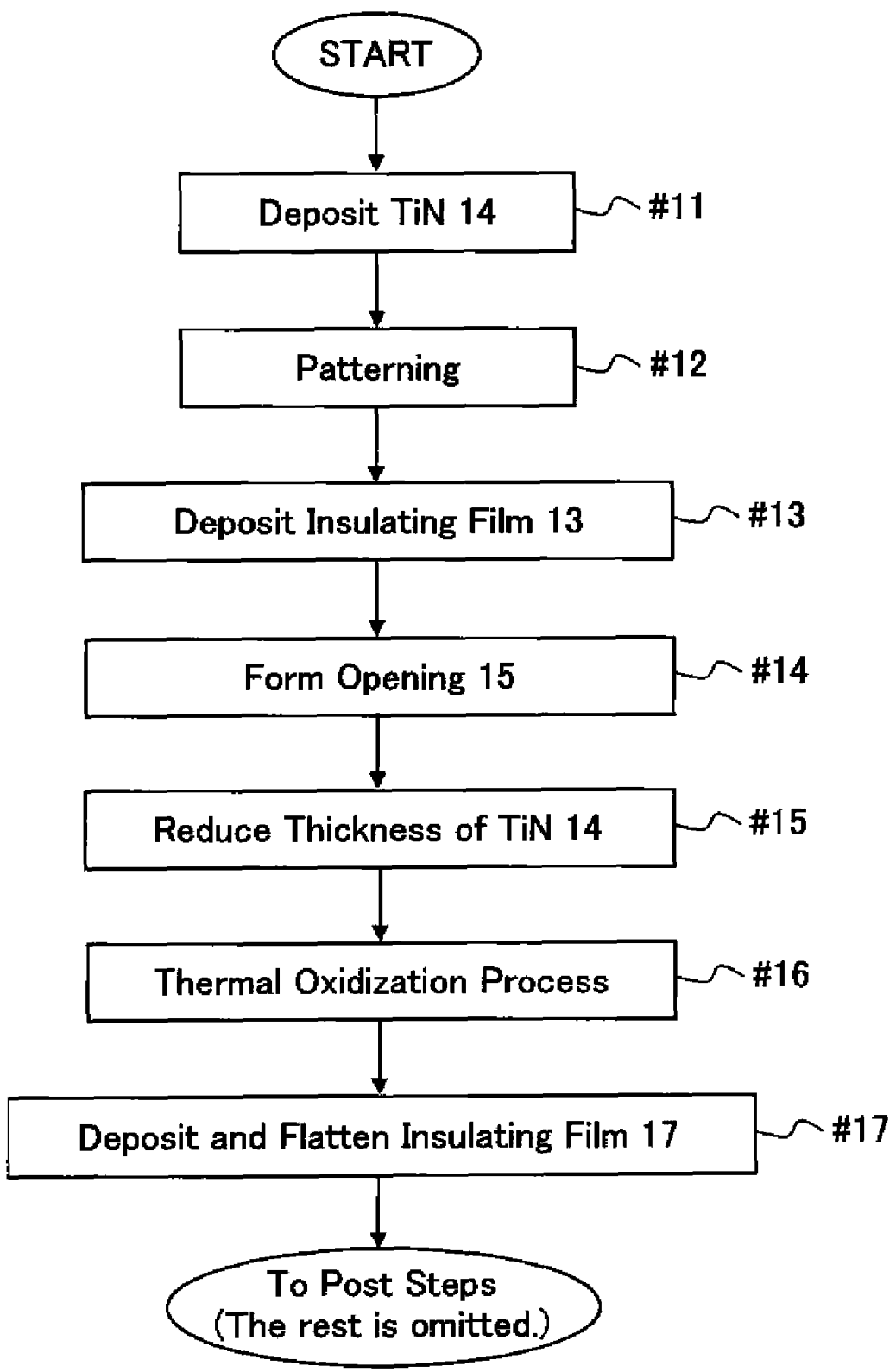
FIG. 2 is a flow chart showing the manufacturing steps in the manufacturing method for a variable resistive element according to the first embodiment of the present invention.

First, as shown in FIG. 1A, a TiN film 14, which is an example of a conductive thin film, is deposited in accordance with a sputtering method so as to have a thickness of 100 nm over the entire surface of a semiconductor substrate 11 where an appropriate transistor circuit or the like (not shown) is formed (Step #11).

Figure 1B:
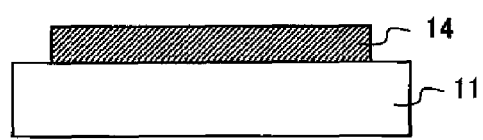

Next, as shown in FIG. 1B, the TiN film 14 is patterned in accordance with a publicly known etching technology using the resist formed in accordance with a well-known photolithographic technology as a mask (Step #12).

Figure 1C:
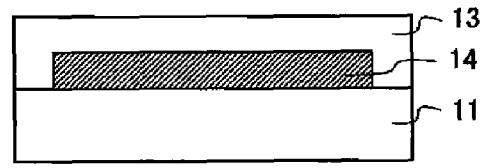

Next, as shown in FIG. 1C, an $SiO_2$ film (first interlayer insulating film) 13 is deposited over the entire surface of the TiN film 14 in accordance with a CVD method so as to have a thickness of 300 nm (Step #13).

Figure 1D:
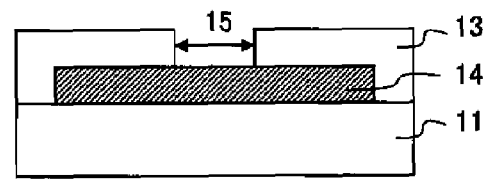

Next, as shown in FIG. 1D, an opening 15 is created in the first interlayer insulating film 13 in accordance with a well-known etching technology using a resist formed in accordance with a well-known photolithographic technology as a mask so that the upper surface of the TiN film 14 in a local region, which is to function as a variable resistor, is exposed (Step #14).

Figure 1E:
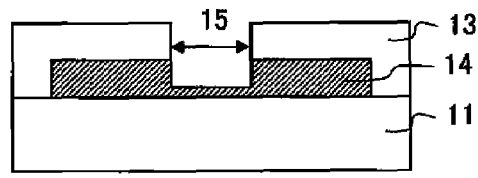

Next, as shown in FIG. 1E, the thickness of the TiN film 14 located in the region beneath the opening 15 is reduced to a predetermined thickness in accordance with a well-known etching technology (Step #15).

Figure 1F:
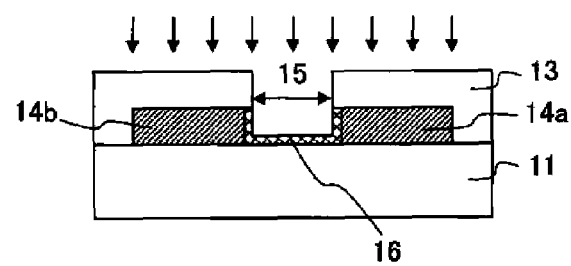

Next, as shown in FIG. 1F, the TiN film 14 in the outer periphery portion of the opening 15 which is not coated with the first interlayer insulating film 13 is oxidized through thermal oxidation, for example, in an atmosphere which includes oxygen at 250° C. to 450° C., so that a $TiO_2$ film 16, which is an example of a variable resistor (hereinafter referred to as "variable resistor film 16"), is formed (Step #16). At this time, thermal oxidation progresses from the surface of the TiN film 14 located in the exposed outer peripheral region of the opening 15 in such a direction as to move away from the opening 15 (in the downward direction and direction to the outside as viewed from the opening 15). When this thermal oxidation which progresses in the downward direction reaches the interface between the upper surface of the semiconductor substrate 11 and the TiN film 14, the TiN film 14 located in the region beneath the opening 15 (and the periphery portion thereof) is converted to a variable resistor film 16. Then, this variable resistor film 16 divides the TiN film 14 into two electrodes (first electrode and second electrode) 14a and 14b.

Figure 1G:
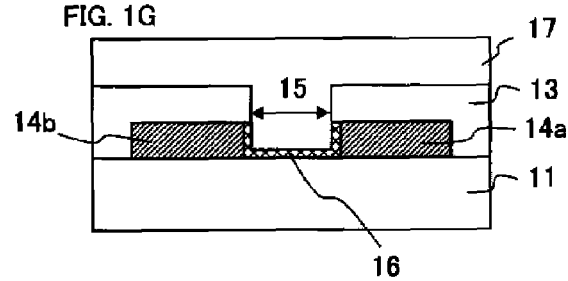

Next, as shown in FIG. 1G, a protective interlayer insulating film 17, such as of $SiO_2$, is deposited so as to have a thickness of 700 nm in accordance with a CVD method and flattened in accordance with a flattening technology using a well-known CMP method or the like (Step #17).

According to the method of the present invention, the variable resistor film 16 can be formed by oxidizing the TiN film 14. Therefore, as a result of the formation of this variable resistor film 16, the TiN film 14 is divided into two portions (first electrode 14a and second electrode 14b), and thus, a variable resistive element (element of the present invention) where a variable resistor 16 is sandwiched between the two electrodes is formed. That is to say, the two electrodes 14a and 14b and the variable resistor film 16 originate from the same TiN film 14, which is layered in one step (Step #11), and the interfaces between the two electrodes 14a and 14b and the variable resistor film 16 are not exposed to a gas or air, therefore, unlike the prior art method, there is no inconsistency in the contact resistance under the effects of an atmosphere in the process for film formation. According to the method of the present invention, the contact resistance can be stabilized between memory cells within the same wafer and between different wafers, therefore, the voltage applied across the two ends of the variable resistor film 16 can be made uniform so that a variable resistive element having a stable switching operation can be formed with excellent reproducibility.

Furthermore, the area of the region in the variable resistor which electrically contributes can be made smaller in accordance with a simple method than the area which is restricted as an area that is processable in accordance with a photolithographic technology according to the prior art, therefore, the amount of current consumed at the time of programming and erasing can be reduced, and a variable resistive element having a stable switching operation where programming does not fail due to low resistance can be formed with excellent reproducibility and at a low cost. Here, the above described effects can be gained in the same manner as in the below described second to seventh embodiments.

Here, in the above described Step #15, the step of reducing the thickness of the TiN film 14 located in the region beneath the opening 15 to a predetermined thickness is carried out. Though this step is preferable in order to implement a memory cell with excellent reproducibility where the area of the region in the variable resistor which electrically contributes is reduced so that the amount of current consumed can be reduced, programming does not fail, and the switching operation can be stable, the process is not necessary in the process for manufacturing the element of the present invention. In the below described fourth embodiment, the results of the experiment are shown where the switching properties of memory cells having a different film thickness of the variable resistor are compared, and it is clarified that the smaller the film thickness of the variable resistor is, the more stable the switching operation can be. In addition, when the step of reducing the film thickness is carried out in this Step #15, such effects are gained that it becomes possible to shorten the required time for oxidation that allows the first electrode 14a and the second electrode 14b to be formed in Step #16.

In addition, though the first interlayer insulating film 13 deposited in Step #13 and the protective interlayer insulating film 17 deposited in Step #17 are both $SiO_2$ films, these interlayer insulating films are not limited to being an $SiO_2$ film, and it is possible to use any appropriate insulating film having resistance to oxidation, such as an SiN film, an SiON film, an SiOF film and an SiOC film. In addition, the first interlayer insulating film 13 and the protective interlayer insulating film 17 may be formed of insulating films made of different materials. This is the same in the following second to sixth embodiments.

In addition, though an appropriate transistor circuit or the like is formed on the semiconductor substrate 11 which becomes the base for the formation of the TiN film 14 in the above described Step #11, it is not necessary for this circuit to be formed. This is the same in the following respective embodiments.

In addition, though the respective interlayer insulating films are deposited in accordance with a CVD method in Step #13 and Step #17, it is possible to deposit interlayer insulating films using any appropriate deposition technology, such as pulse laser deposition, rf-sputtering, electron beam vapor deposition, thermal vapor deposition or spin-on deposition. This is the same in the following respective embodiments unless otherwise stated.

Furthermore, it is possible to form appropriate metal wires (not shown), which are formed to make electrical contact with the first electrode 14a and the second electrode 14b, respectively, in the step either before or after the step of depositing the TiN film 14. This is the same in the following respective embodiments unless otherwise stated.

SECOND EMBODIMENT

The method according to the second embodiment (hereinafter referred to as "present embodiment") of the present invention is described below in reference to FIGS. 3A to 3G and 4. FIGS. 3A to 3G are cross sectional diagrams schematically illustrating the steps for the manufacture of a semiconductor device according to the present embodiment, respectively. In addition, FIG. 4 is a flow chart showing the manufacturing steps according to the present embodiment, and the respective steps in the following represent the respective steps in the flow chart shown in FIG. 4.

Figure 3A:
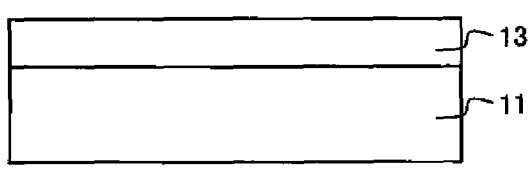
FIGS. 3A to 3G are cross sectional diagrams schematically illustrating the manufacturing steps in the manufacturing method for a variable resistive element according to the second embodiment of the present invention.
Figure 4:
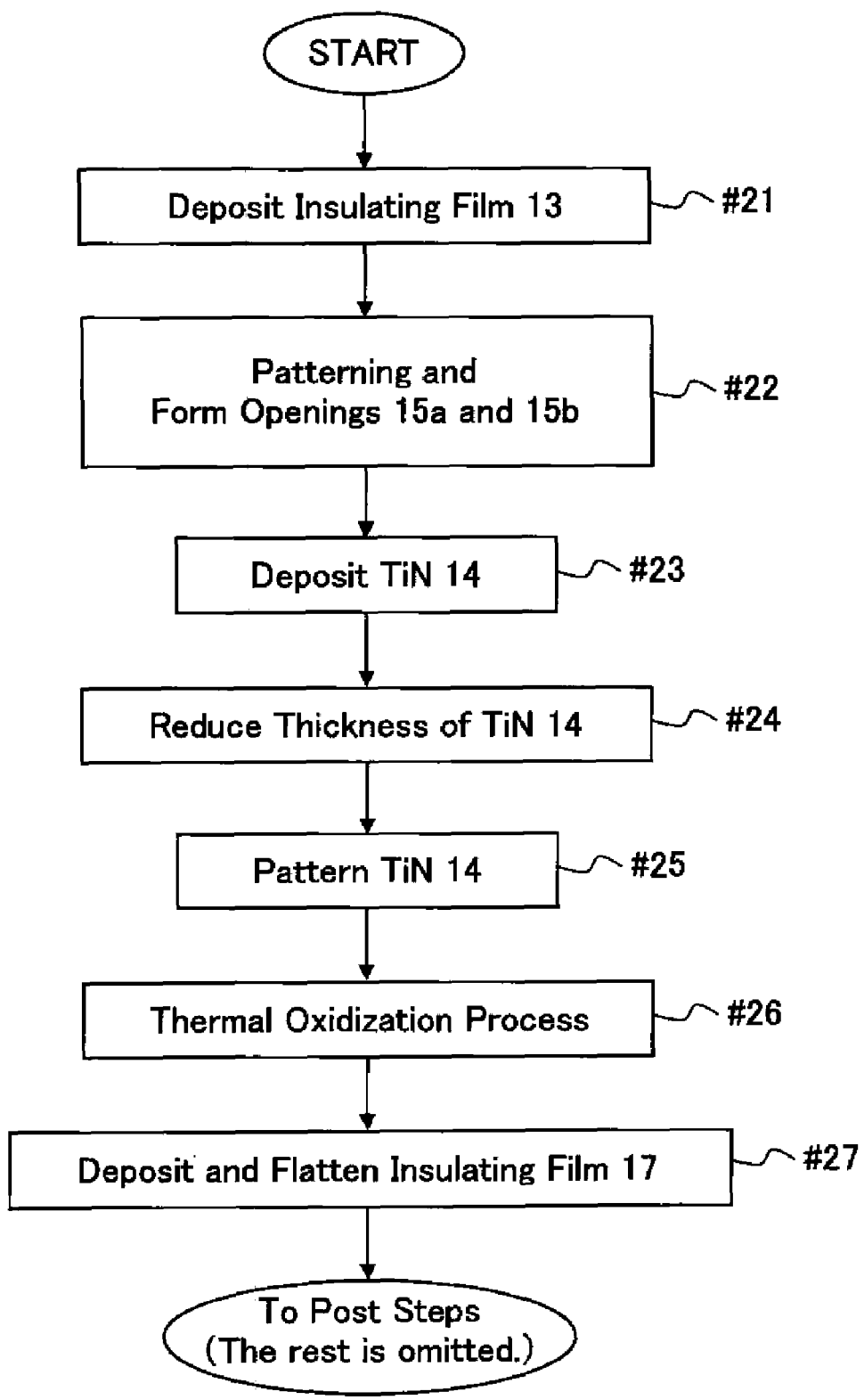
FIG. 4 is a flow chart showing the manufacturing steps in the manufacturing method for a variable resistive element according to the second embodiment of the present invention.

First, as shown in FIG. 3A, an $SiO_2$ film (first interlayer insulating film) 13 is deposited on the entire surface of the semiconductor substrate 11 where an appropriate transistor circuit or the like (not shown) is formed in accordance with a CVD method so as to have a thickness of 100 nm (Step #21).

Figure 3B:
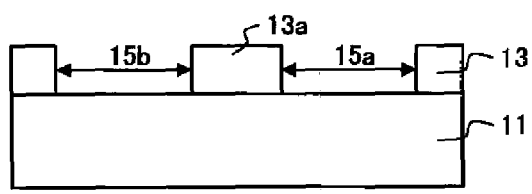

Next, as shown in FIG. 3B, the first interlayer insulating film 13 is patterned in accordance with a well-known etching technology using a resist formed in accordance with a well-known photolithographic technology as a mask, and openings 15a and 15b are created so that the upper surface of the semiconductor substrate 11 is exposed (Step #22). At this time, the openings are created in locations where the first electrode and the second electrode are to be formed in the subsequent step, and the first interlayer insulating film 13 remains in the region which is sandwiched by the two locations where the first electrode and the second electrode are to be formed (openings 15a and 15b). In the following, the first interlayer insulating film 13 which remains in the region sandwiched between the two openings 15a and 15b is referred to as "first interlayer insulating film 13a."

Figure 3C:
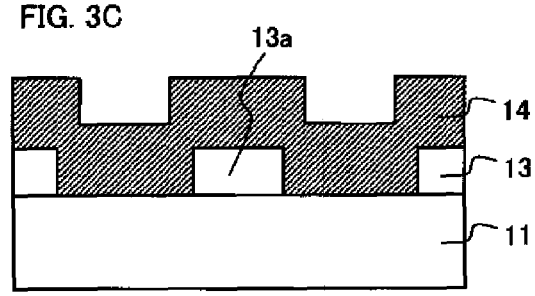

Next, as shown in FIG. 3C, a TiN film 14, which is an example of a conductive thin film, is deposited over the entire surface of the semiconductor substrate 11 in accordance with a sputtering method so as to have a film thickness (for example, 150 nm) which is at least greater than the film thickness of the first interlayer insulating film 13 deposited in Step #21 (Step #23). As a result, the opening 15 is completely filled in with the TiN film 14, and at the same time, the TiN film 14 in the opening 15 is deposited to a level higher than the upper surface of the first interlayer insulating film 13 deposited around the opening.

Figure 3D:
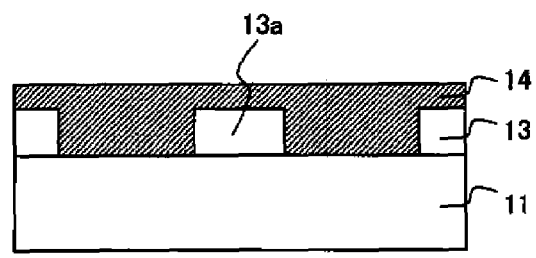

Next, as shown in FIG. 3D, the thickness of the TiN film 14 formed on the upper surface of the first interlayer insulating film 13 is reduced to a predetermined thickness in accordance with a well-known CMP technology or etching technology (Step #24). At this time, the film thickness of the TiN film 14 deposited within the opening 15 and in the region above the opening is not smaller than the film thickness of the TiN film 14 deposited in the region above the first interlayer insulating film 13.

Figure 3E:
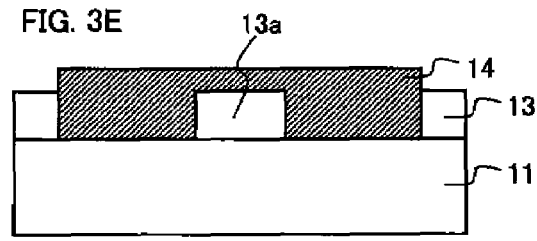

Next, as shown in FIG. 3E, the TiN film 14 is patterned in accordance with a well-known etching technology using a resist formed in accordance with a well-known photolithographic technology as a mask. Concretely, the TiN film 14 on the first interlayer insulating film 13 is removed by etching except the TiN film 14 in an upper region of the openings 15a and 15b and that on the first interlayer insulating film 13a which is sandwiched between the openings 15a and 15b.

Figure 3F:
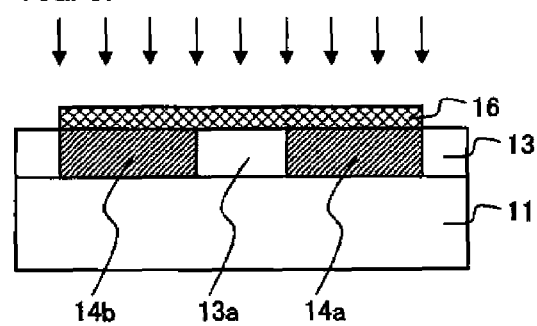

Next, as shown in FIG. 3F, the TiN film 14 is oxidized through thermal oxidation, for example, in an atmosphere which includes oxygen at 250° C. to 450° C., and a $TiO_2$ film 16, which is an example of a variable resistor (hereinafter referred to as "variable resistor film 16"), is formed (Step #26). At this time, thermal oxidation is carried out in such a manner that the oxidation of the TiN film 14 deposited in the region above the first interlayer insulating film 13a progresses from the upper surface to the interface between the TiN film 14 and the first interlayer insulating film 13a. As a result, the openings 15a and 15b keep being filled in with an unoxidized TiN film 14, and thus, the variable resistor film 16 is formed above the unoxidized TiN film 14 and on the first interlayer insulating film 13a. That is to say, as a result of the present step, the TiN film 14 is divided into a TiN film 14a in an unoxidized state (first electrode) with which the opening 15a is filled in and a TiN film 14b in an unoxidized state (second electrode) with which the opening 15b is filled in.

Figure 3G:
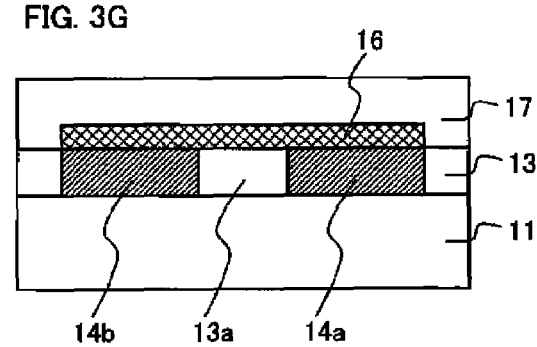

Next, as shown in FIG. 3G, a protective interlayer insulating film 17, such as of $SiO_2$, is deposited in accordance with a CVD method so as to have a thickness of 700 nm and flattened in accordance with a flattening technology using a well-known CMP method or the like (Step #27).

In the present embodiment, like in the first embodiment, the variable resistor film 16 is formed by oxidizing the TiN film 14. Therefore, the TiN film 14 is divided into two portions (first electrode 14a and second electrode 14b) as a result of the formation of the variable resistor film 16, and thus, a variable resistive element where a variable resistor 16 is sandwiched between the two electrodes is formed. Accordingly, the interfaces between the two electrodes 14a and 14b and the variable resistor film 16 are not exposed to a gas or air, therefore, unlike the prior art method, there is no inconsistency in the contact resistance by being affected by the atmosphere in the process for film formation, and the contact resistance can be stabilized and consistent between memory cells within the same wafer and between different wafers. As a result, the voltage applied across the two ends of the variable resistor film 16 can be made uniform so that a variable resistive element having a stable switching operation can be formed with excellent reproducibility.

THIRD EMBODIMENT

The method according to the third embodiment (hereinafter referred to as "present embodiment") of the present invention is described below in reference to FIGS. 5A to 8. FIGS. 5A to 5E are cross sectional diagrams schematically illustrating the steps for the manufacture of a semiconductor device according to the present embodiment, respectively. In addition, FIG. 6 is a flow chart showing the manufacturing steps according to the present embodiment, and the respective steps in the following represent the respective steps in the flow chart shown in FIG. 6.

Figure 5A:
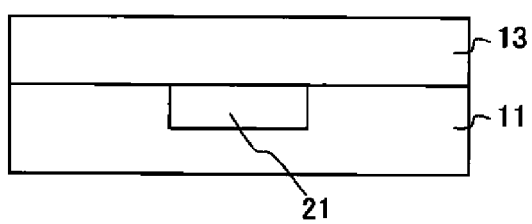
FIGS. 5A to 5E are cross sectional diagrams schematically illustrating the manufacturing steps in the manufacturing method for a variable resistive element according to the third embodiment of the present invention.
Figure 6:
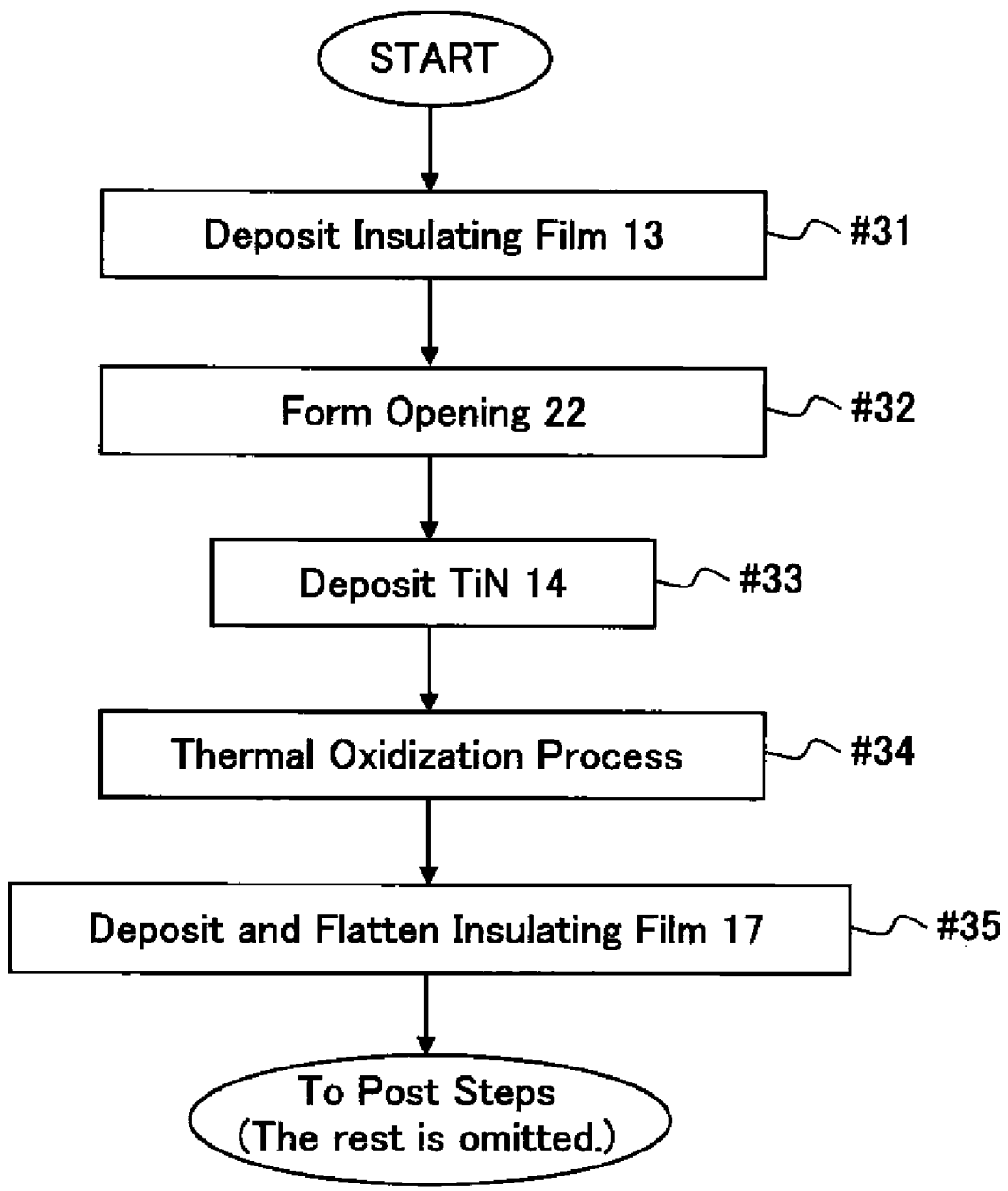
FIG. 6 is a flow chart showing the manufacturing steps in the manufacturing method for a variable resistive element according to the third embodiment of the present invention.

First, as shown in FIG. 5A, an $SiO_2$ film (first interlayer insulating film) 13 is deposited over the entire surface of the semiconductor substrate 11 where an appropriate transistor circuit or the like (not shown) and a metal wiring 21 are formed in accordance with a CVD method so as to have a thickness of 400 nm (Step #31).

Figure 5D:
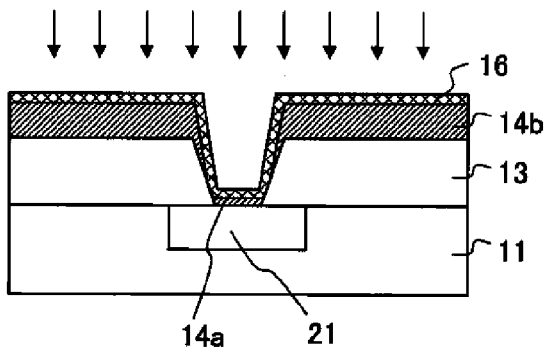
Figure 5B:
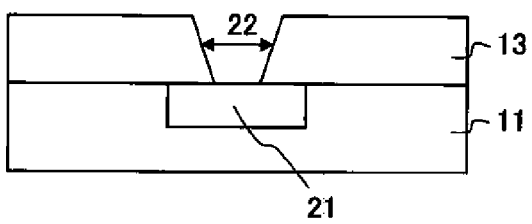

Next, as shown in FIG. 5B, the first interlayer insulating film 13 is patterned in accordance with a well-known etching technology using a resist formed in accordance with a well-known photolithographic technology as a mask so that an opening 22 having a diameter of approximately 200 nm is created until the metal wiring 21 are exposed (Step #32). At this time, etching is carried out so that the opening 22 is tapered in such a manner that the area of the opening becomes smaller from the upper region to the lower region.

Figure 5E:
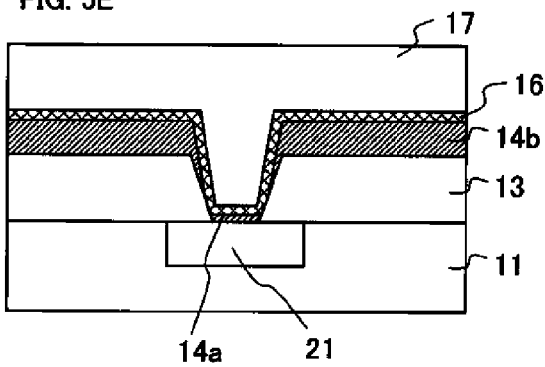
Figure 5C:
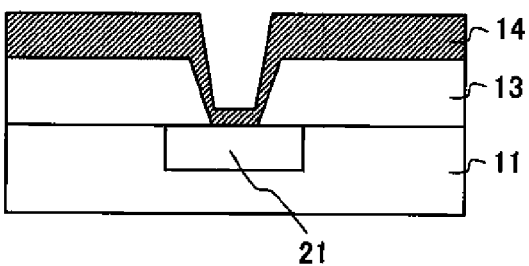

Next, as shown in FIG. 5C, a TiN film 14, which is an example of a conductive thin film, is deposited over the entire surface of the semiconductor substrate 11 in accordance with a sputtering method so as to have a thickness of 60 nm (Step #33). In Step #32, the opening 22 is created so as to have a tapered form, therefore, the TiN film 14 is deposited on the inclined portion on the inner wall of the opening 22, and as a result, the TiN film 14 can be formed in such a manner that the film thickness is smaller toward the lower portion from the upper portion within the opening 22 so that a portion of which the film thickness is smaller than in the other regions (hereinafter referred to as "locally thin film region") can be formed in the TiN film 14. At this time, the TiN film 14 is deposited in such a manner that the opening 22 is not completely filled in with the TiN film 14.

Next, as shown in FIG. 5D, the TiN film 14 is oxidized through thermal oxidation, for example, in an atmosphere which includes oxygen at 250° C. to 450° C. so that a $TiO_2$ film 16, which is an example of a variable resistor (hereinafter referred to as "variable resistor film 16"), is formed (Step #34). At this time, thermal oxidation progresses from the surface of the TiN film 14 deposited on the sidewall inside the opening 22 to the interface between the TiN film 14 and the first interlayer insulating film 13 (in other words, the TiN film 14 in the locally thin film region is oxidized throughout the entire film thickness at least in the locally thin film region), and as a result, the TiN film 14 deposited on the sidewall inside the opening 22 is converted to a variable resistor film 16. At this time, the oxidizing process is carried out under predetermined conditions in terms of the pressure, temperature and processing time so that the TiN film 14 formed at the bottom of the opening 22 is not completely oxidized, and an unoxidized TiN film 14 partially remains in the region. That is to say, the unoxidized TiN film 14 is formed in a portion which makes contact with the upper surface of the metal wiring 21 at the bottom of the opening 22, and the variable resistor film 16 where the TiN film 14 is oxidized is formed in the region above the unoxidized TiN film 14. In this Step #34, the TiN film 14 is divided into an electrode (first electrode) 14a which makes contact with the metal wiring 21 via the variable resistor film 16 and the electrode made of the remaining portion (second electrode) 14b. Here, in the case where the TiN film 14 having a thickness of approximately 9 nm is deposited on the sidewall inside the opening 22, a thermal oxidation process is carried out under the conditions of normal pressure (760 Torr) and at 300° C. for approximately 40 minutes, and thus, it is possible to completely oxidize the TiN film 14 deposited in this sidewall portion. In the case where the TiN film 14 having a thickness sufficiently greater than 9 nm is deposited at the bottom of the opening 22, the TiN film 14 formed at the bottom of the opening 22 is not completely oxidized and a partially unoxidized TiN film 14 which makes contact with the metal wiring 21 remains.

Next, as shown in FIG. 5E, a protective interlayer insulating film 17 such as of $SiO_2$, is deposited in accordance with a CVD method so as to have a thickness of 700 nm and flattened in accordance with a flattening technology, such as a well-known CMP method (Step #35).

In the present embodiment, in the same manner as in the first and second embodiments, a variable resistor film 16 is formed by oxidizing the TiN film 14. In addition, as a result of the formation of the variable resistor film 16, the TiN film 14 is divided into two portions (first electrode 14a and second electrode 14b), and as a result, a variable resistive element where the variable resistor 16 is sandwiched between the two electrodes is formed. Accordingly, the interfaces between the two electrodes 14a and 14b and the variable resistor film 16 are not exposed to a gas or air, therefore, unlike conventional methods, there is no inconsistency in the contact resistance by being affected by the atmosphere in the process for film formation, and contact resistance can be stabilized and consistent between memory cells within the same wafer and between different wafers. As a result, the voltage applied across the two ends of the variable resistor film 16 can be made uniform so that a variable resistive element having a stable switching operation can be formed with excellent reproducibility.

Here, in the present embodiment, in the case where a patterning process is carried out on the TiN film 14 and the variable resistor film 16, it is preferable to form a predetermined oxidation preventing insulating film in advance before carrying out a patterning process.

Figure 7A:
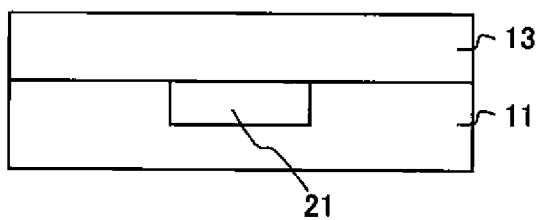
FIGS. 7A to 7G are cross sectional diagrams schematically illustrating the manufacturing steps in the manufacturing method for a variable resistive element according to another version of the third embodiment of the present invention.
Figure 7D:
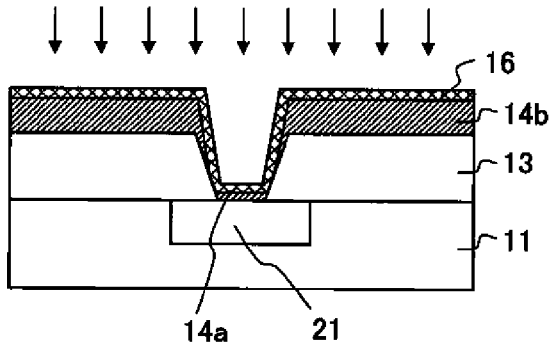
Figure 7B:
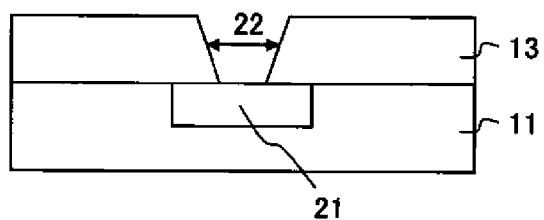
Figure 7E:
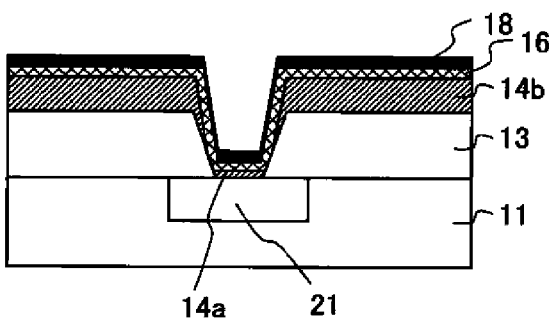
Figure 7C:
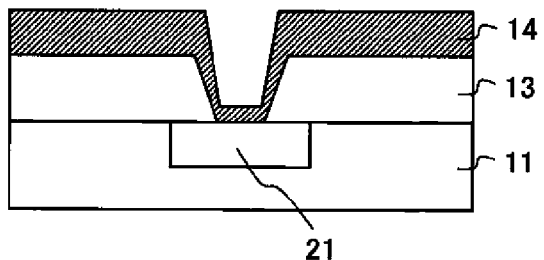
Figure 7F:
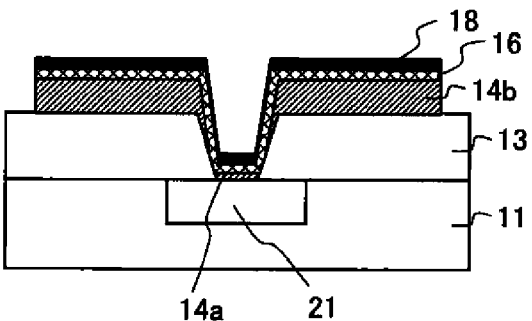
Figure 7G:
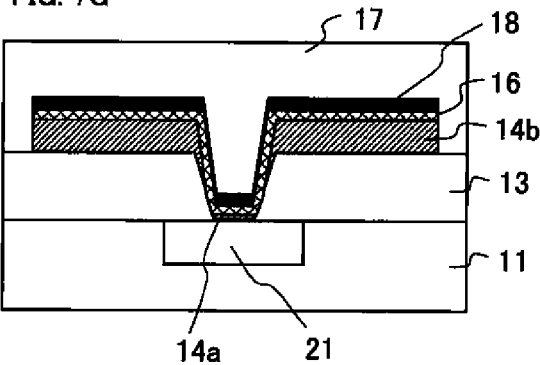
Figure 8:
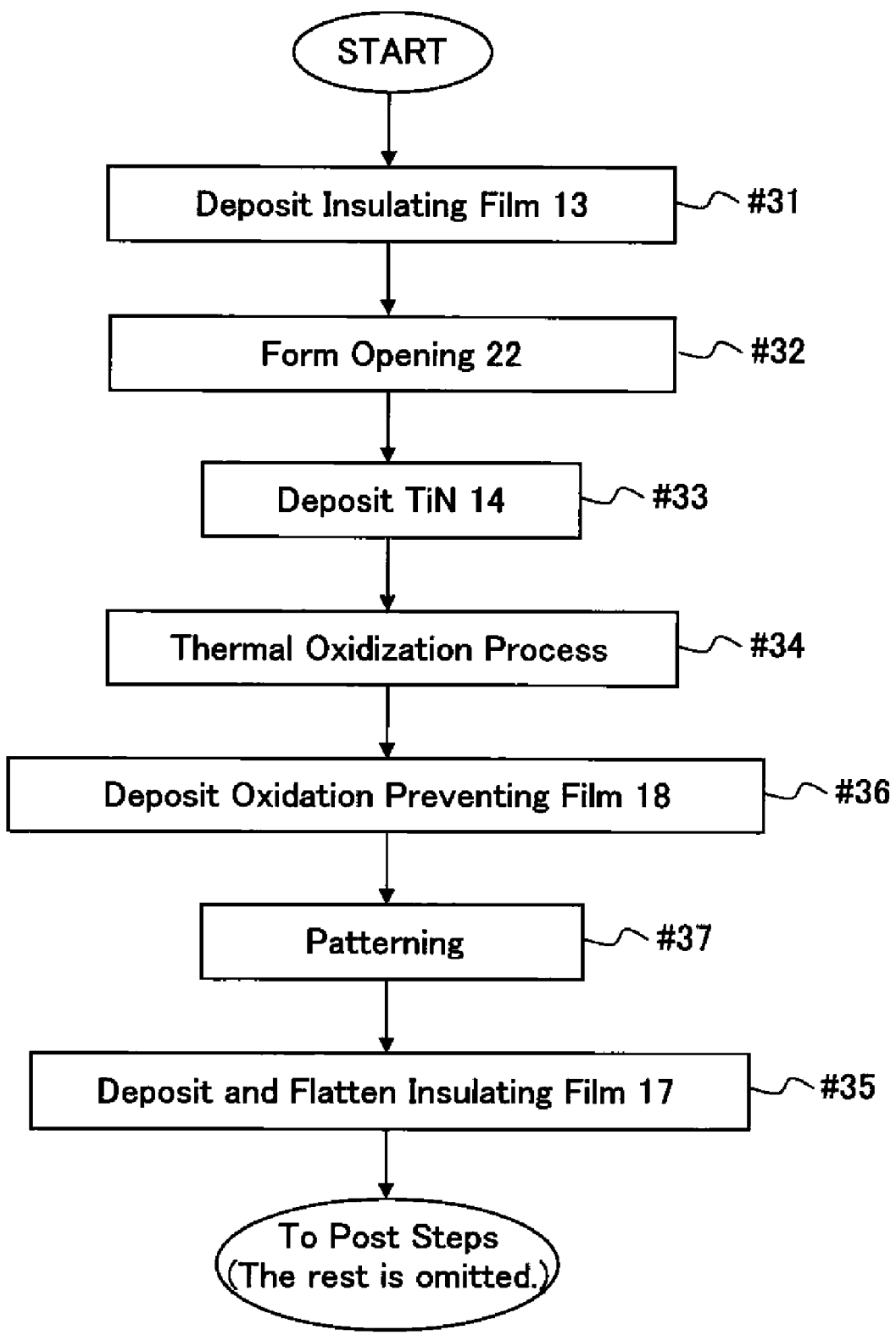
FIG. 8 is a flow chart showing the manufacturing steps in the manufacturing method for a variable resistive element according to another version of the third embodiment of the present invention.

FIGS. 7A to 7G and 8 are a schematic cross sectional diagram and a flow chart of another manufacturing process according to the present embodiment. As shown in FIG. 7E, after the completion of the thermal oxidation process (Step #34), an oxidation preventing insulating film 18, such as of SiON, SiN, SiOC or SiC, is deposited in accordance with a CVD method so as to have a thickness of approximately 50 nm (Step #36). After that, as shown in FIG. 7F, the oxidation preventing insulating film 18, the variable resistor film 16 and the TiN film 14 are patterned in accordance with a well-known etching technology using a resist formed in accordance with a well-known photolithographic technology as a mask (Step #37). After that, as shown in FIG. 7G, in the same manner as in FIG. 5E, a protective interlayer insulating film 17 is deposited, and a flattening process is carried out (Step #35).

As described above, an oxidation preventing insulating film 18 is formed in advance before the patterning process in Step #37, and thus, the variable resistor film 16 can be prevented from being affected by the oxidation in the resist ashing process or the like during the patterning process so that a variable resistive element can be manufactured without deteriorating the properties of the above described variable resistor.

FOURTH EMBODIMENT

The method according to the fourth embodiment of the present invention (hereinafter referred to as "present embodiment") is described in reference to FIGS. 9 to 13. FIGS. 9A to 9G are schematic cross sectional diagrams illustrating the respective steps for the manufacture of a semiconductor device according to the present embodiment, and FIGS. 9A to 9G show individual steps. In addition, FIG. 10 is a flow chart showing the manufacturing steps according to the present embodiment, and each step in the following shows each step in the flow chart shown in FIG. 10.

Figure 9A:
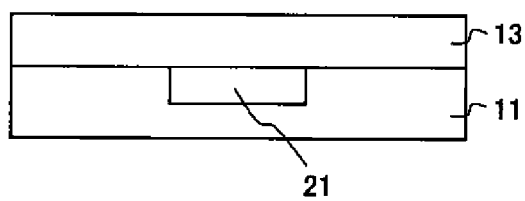
FIGS. 9A to 9G are cross sectional diagrams schematically illustrating the manufacturing steps in the manufacturing method for a variable resistive element according to the fourth embodiment of the present invention.
Figure 10:
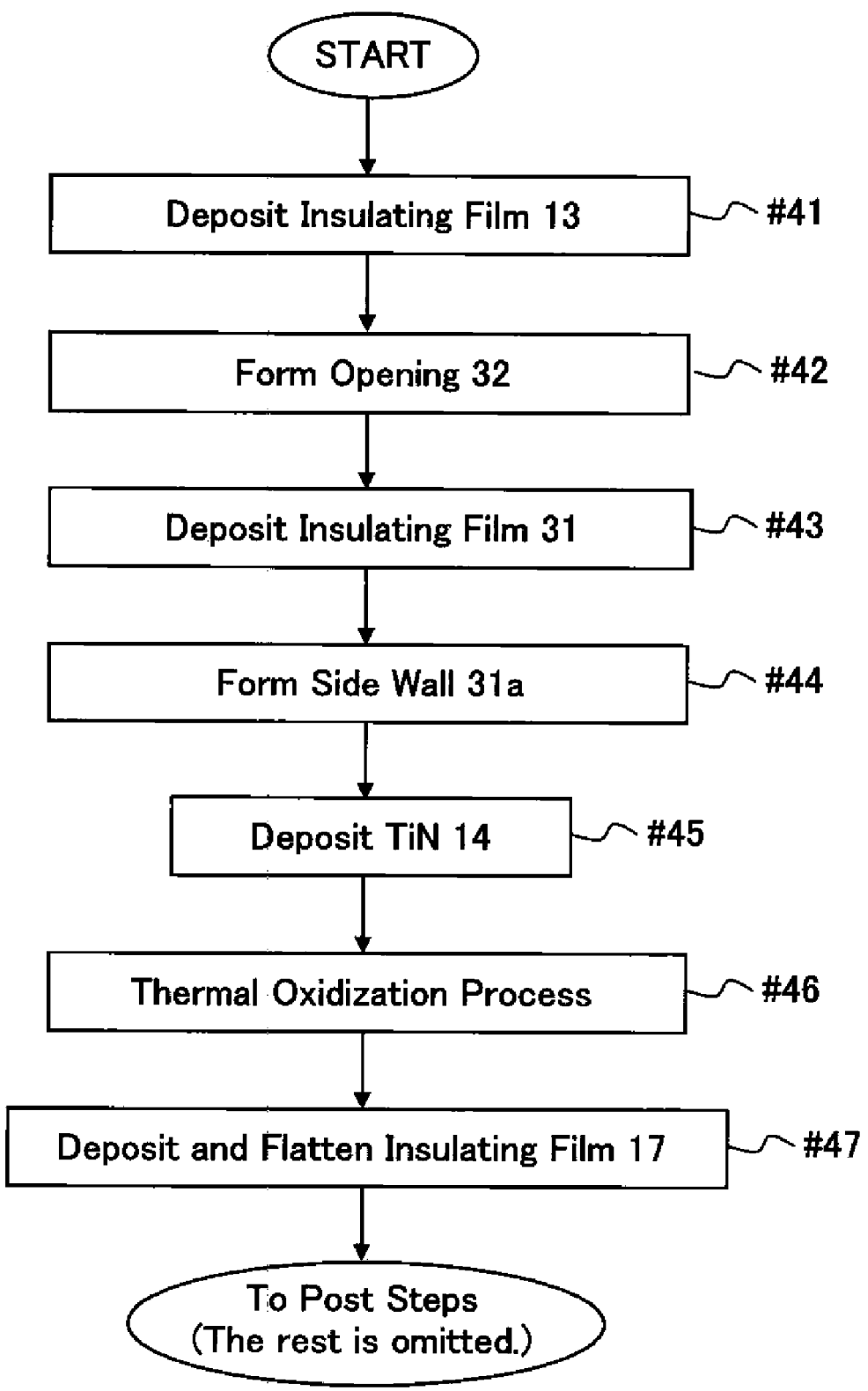
FIG. 10 is a flow chart showing the manufacturing steps in the manufacturing method for a variable resistive element according to the fourth embodiment of the present invention.

First, as shown in FIG. 9A, an $SiO_2$ film (first interlayer insulating film) 13 is deposited on the entire surface of a semiconductor substrate 11 where an appropriate transistor circuit (not shown) and appropriate metal wirings 21 are formed in accordance with a CVD method so as to have a thickness of 400 nm (Step #41).

Figure 9E:
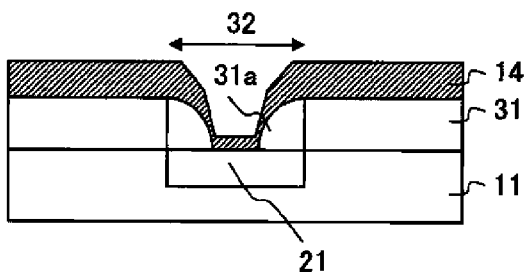
Figure 9B:
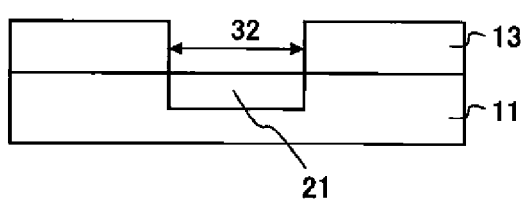

Next, as shown in FIG. 9B, an opening 32 having a predetermined hole diameter of approximately 400 nm is created in the first interlayer insulating film 13 in the region above a metal wiring 21 so that the top of the metal wiring 21 is exposed in accordance with a well-known etching technology using a resist formed in accordance with a well-known photolithographic technology as a mask (Step #42).

Figure 9F:
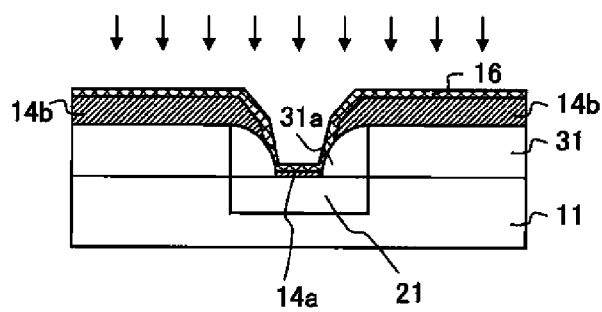
Figure 9C:
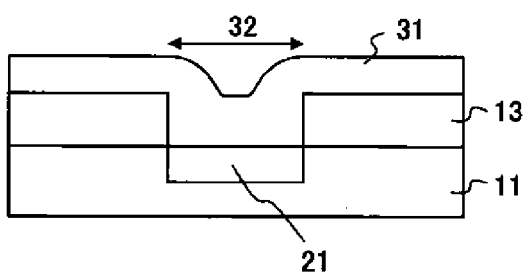

Next, as shown in FIG. 9C, an $SiO_2$ film (insulating film for the formation of a sidewall) 31 is deposited on the entire surface so as to have such a film thickness that the opening 32 is not completely filled in (for example, approximately 170 nm) (Step #43).

Figure 9G:
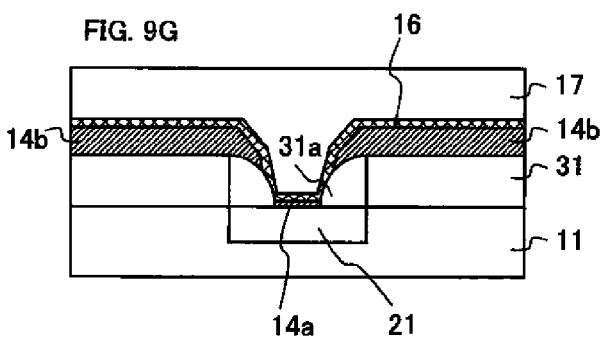
Figure 9D:
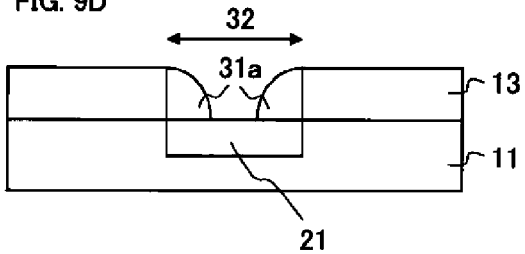

Next, as shown in FIG. 9D, etch-back is carried out on the entire surface in accordance with a well-known etching technology so that the upper surface of the metal wiring 21 is exposed, and a sidewall 31a of which the width increases toward the bottom is formed on the sidewall surface of the opening 32 (Step #44).

Next, as shown in FIG. 9E, a TiN film 14, which is an example of a conductive thin film, is deposited on the entire surface of the semiconductor substrate 11 in accordance with a sputtering method so as to have a thickness of 60 nm (Step #45). At this time, as a result of the formation of the sidewall 31a in Step #44, the TiN film 14 is deposited in an outer wall portion of the sidewall 31a, and consequently, the TiN film 14 can be formed so that the film thickness decreases from the top to the bottom within the opening 32, and thus, in the same manner as in the third embodiment, a local thin film region where the film thickness is smaller than the other regions can be formed within the TiN film 14. At this time, the TiN film 14 is deposited in such a manner that the opening 32 is not completely filled in with the TiN film 14.

Next, as shown in FIG. 9F, the TiN film 14 is oxidized through thermal oxidation, for example, in an atmosphere which includes oxygen at 250° C. to 450° C., so that a $TiO_2$ film 16 (hereinafter referred to as "variable resistor film 16") is formed as an example of a variable resistor (Step #46). At this time, thermal oxidation is carried out so as to reach from the surface of the TiN film 14 deposited in an outer wall portion of the sidewall 31a to the interface between the TiN film 14 and the first interlayer insulating film 13 (in other words, the TiN film 14 in at least the local thin film region is oxidized throughout the film thickness of the local thin film region), and as a result, the TiN film 14 deposited on the inner sidewall of the opening 32 is converted to a variable resistor film 16. At this time, the oxidation process is carried out under predetermined conditions in terms of pressure, temperature and time for processing, and thus, the TiN film 14 formed at the bottom of the opening 32 (that is to say, the upper surface of the metal wiring 21) is not completely oxidized, and a partially unoxidized TiN film 14 remains in this region. That is to say, the unoxidized TiN film 14 is formed in the portion of the bottom of the opening 32 which makes contact with the upper surface of the metal wiring 21, and a variable resistor film 16, which is the oxidized TiN film 14, is formed in the region on top of the unoxidized TiN film 14. In this Step #46, the TiN film 14 is divided by the variable resistor film 16 into an electrode (first electrode) 14a which makes contact with the metal wiring 21 and an electrode (second electrode) 14b made of the other part. Here, the thermal oxidation process may be carried out, for example, under the conditions of normal pressure (760 Torr) and 300° C. for approximately 40 minutes in the same manner as in the third embodiment.

Next, as shown in FIG. 9G, a protective interlayer insulating film 17, such as SiO$_2$, is deposited in accordance with a CVD method so as to have a thickness of 700 nm and flattened in accordance with a flattening technology, such as a well-known CMP method (Step #47).

In the present embodiment, in the same manner as in the first to third embodiments, a variable resistor film 16 is formed by oxidizing the TiN film 14. In addition, as a result of the formation of the variable resistor film 16, the TiN film 14 is divided into two portions (first electrode 14a and second electrode 14b), and as a result, a variable resistive element where a variable resistor 16 is sandwiched between the two electrodes is formed. Accordingly, the interfaces between the two electrodes 14a and 14b and the variable resistor film 16 are not exposed to a gas or air, therefore, unlike conventional methods, there is no inconsistency in the contact resistance by being affected by an atmosphere in the process for film formation, and thus, contact resistance can be stabilized and consistent between memory cells within the same wafer and between different wafers. As a result, the voltage applied across the two ends of the variable resistor film 16 can be made uniform, and a variable resistive element having a stable switching operation can be formed with excellent reproducibility.

Figure 11:
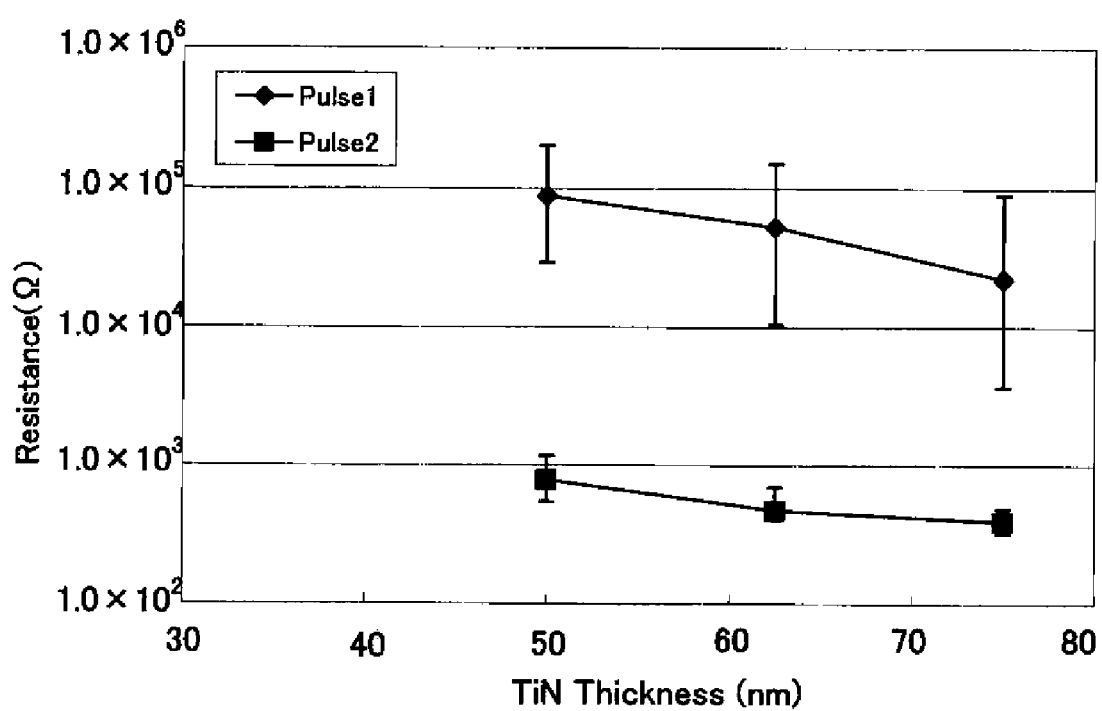
FIG. 11 is a graph showing the switching properties of a variable resistive element manufactured in the manufacturing steps of the manufacturing method according to the fourth embodiment of the present invention.

FIG. 11 is a graph showing the switching properties of a variable resistive element which is manufactured in accordance with the method according to the present embodiment of the present invention, and the film thickness of the TiN film 14 deposited in Step #45 is along the lateral axis and the resistance value of the variable resistive element is along the longitudinal axis (logarithm scale) in the graph.

That is to say, a first pulse voltage (voltage: −2.6 [V], pulse width: 35 [nsec] which is shown as "pulse 1" in the figure) and a second pulse voltage (voltage: +2.0 [V], pulse width: 35 [nsec] which is shown as "pulse 2" in the figure) are alternately applied to the variable resistive element which is manufactured in accordance with the method according to the present embodiment of the present invention, and the range of the measurement results of the resistance value which is measured after the application of each voltage (read resistance value) is shown in the graph. At this time, the read out resistance was measured using a number of samples manufactured by varying the film thickness of the TiN film 14 deposited in Step #45 (three types in FIG. 11). Here, in the read out process, resistance values measured by applying a voltage of 0.5 [V] are shown.

It can be seen from FIG. 11 that there is little inconsistency between samples in the resistance value read after the application of the second pulse voltage and there is little difference between samples, while there is inconsistency between samples in the resistance value read after the application of the first pulse voltage, and the degree of this inconsistency increases as the film thickness of the TiN film 14 increases. In other words, the inconsistency in the read resistance can be reduced by reducing the film thickness of the TiN film 14, and thus, it is suggested that stable switching properties can be gained.

Here, in the case where a patterning process is carried out on the TiN film 14 and the variable resistor film 16 in the present embodiment, in the same manner as in the third embodiment, it is preferable to form a predetermined oxidation preventing insulating film in advance before carrying out the patterning process.

Figure 12A:
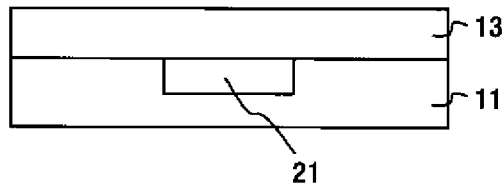
FIGS. 12A to 12I are cross sectional diagrams schematically illustrating the manufacturing steps in the manufacturing method for a variable resistive element according to another version of the fourth embodiment of the present invention.
Figure 12B:
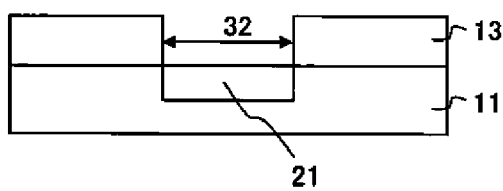
Figure 12C:
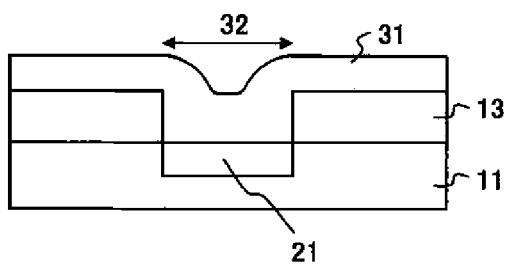
Figure 12D:
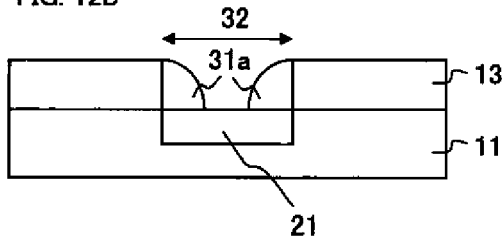
Figure 12E:
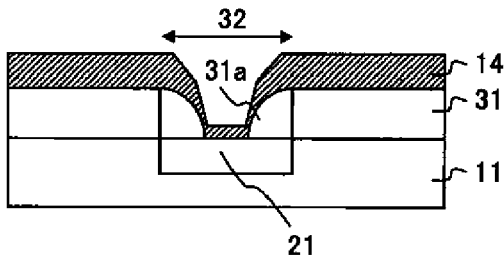
Figure 12F:
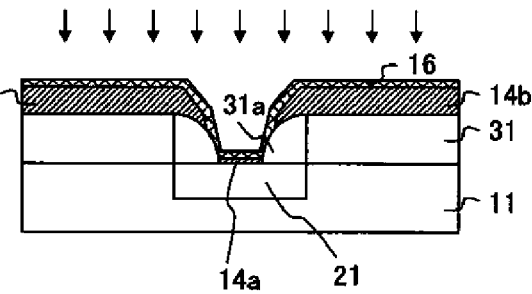
Figure 12G:
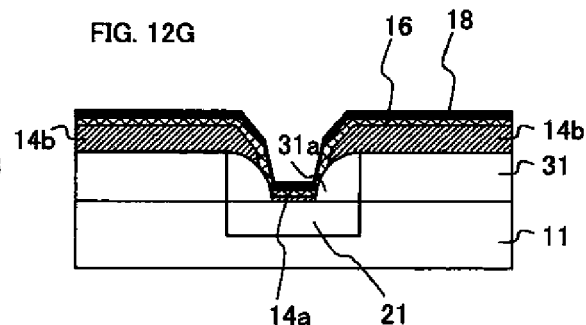
Figure 12H:
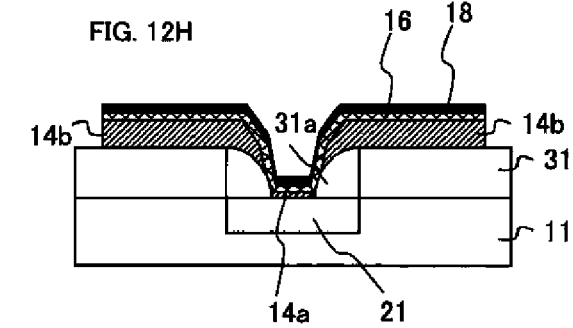
Figure 12I:
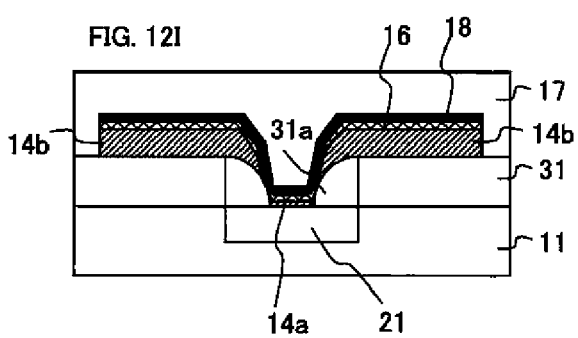
Figure 13:
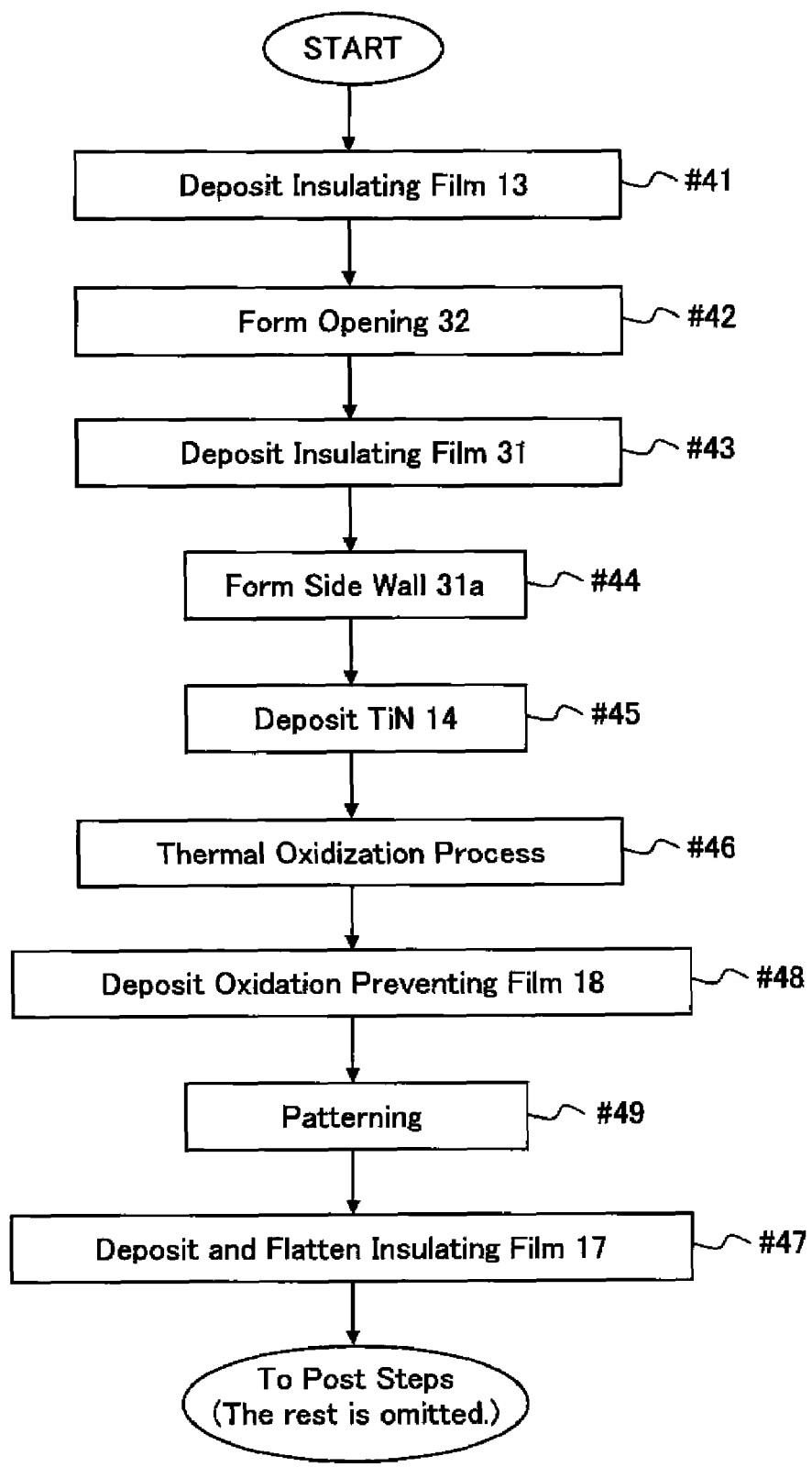
FIG. 13 is a flow chart showing the manufacturing steps in the manufacturing method for a variable resistive element according to another version of the fourth embodiment of the present invention.

FIGS. 12A to 12I and 13 are schematic cross sectional diagrams and a flow chart of another manufacturing process in the present embodiment. As shown in FIG. 12G, after the completion of the thermal oxidation process (Step #46), an oxidation preventing insulating film 18, such as of SiON, SiN, SiOC or SiC, is deposited in accordance with a CVD method so as to have a thickness of approximately 50 nm (Step #48). After that, as shown in FIG. 12H, the oxidation preventing insulating film 18, the variable resistor film 16 and the TiN film 14 are patterned in accordance with a well-known etching technology using a resist formed in accordance with a well-known photolithographic technology as a mask (Step #49). After that, as shown in FIG. 12I, in the same manner as in FIG. 9G, a protective interlayer insulating film 17 is deposited and a flattening process is carried out (Step #47).

As described above, the oxidation preventing insulating film 18 is formed in advance before the patterning process in Step #49, and thus, the variable resistor film 16 can be prevented from being affected by the oxidation in the patterning process, for example, that of the resist ashing process, so that a variable resistive element can be manufactured without deteriorating the properties of the above described variable resistor.

FIFTH EMBODIMENT

The method according to fifth embodiment of the present invention (hereinafter referred to as "present embodiment") is described below in reference to FIGS. 14A to 17. FIGS. 14A to 14E are schematic cross sectional diagrams showing the respective steps at the time of the manufacture of a semiconductor device in the present embodiment, and FIGS. 14A to 14E show the individual steps. In addition, FIG. 15 is a flow chart showing the manufacturing steps in the present embodiment, and each step in the following shows each step in the flow chart shown in FIG. 14.

Figure 14A:
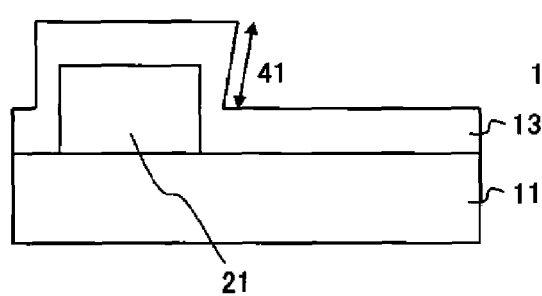
FIGS. 14A to 14E are cross sectional diagrams schematically illustrating the manufacturing steps in the manufacturing method for a variable resistive element according to the fifth embodiment of the present invention.
Figure 15:
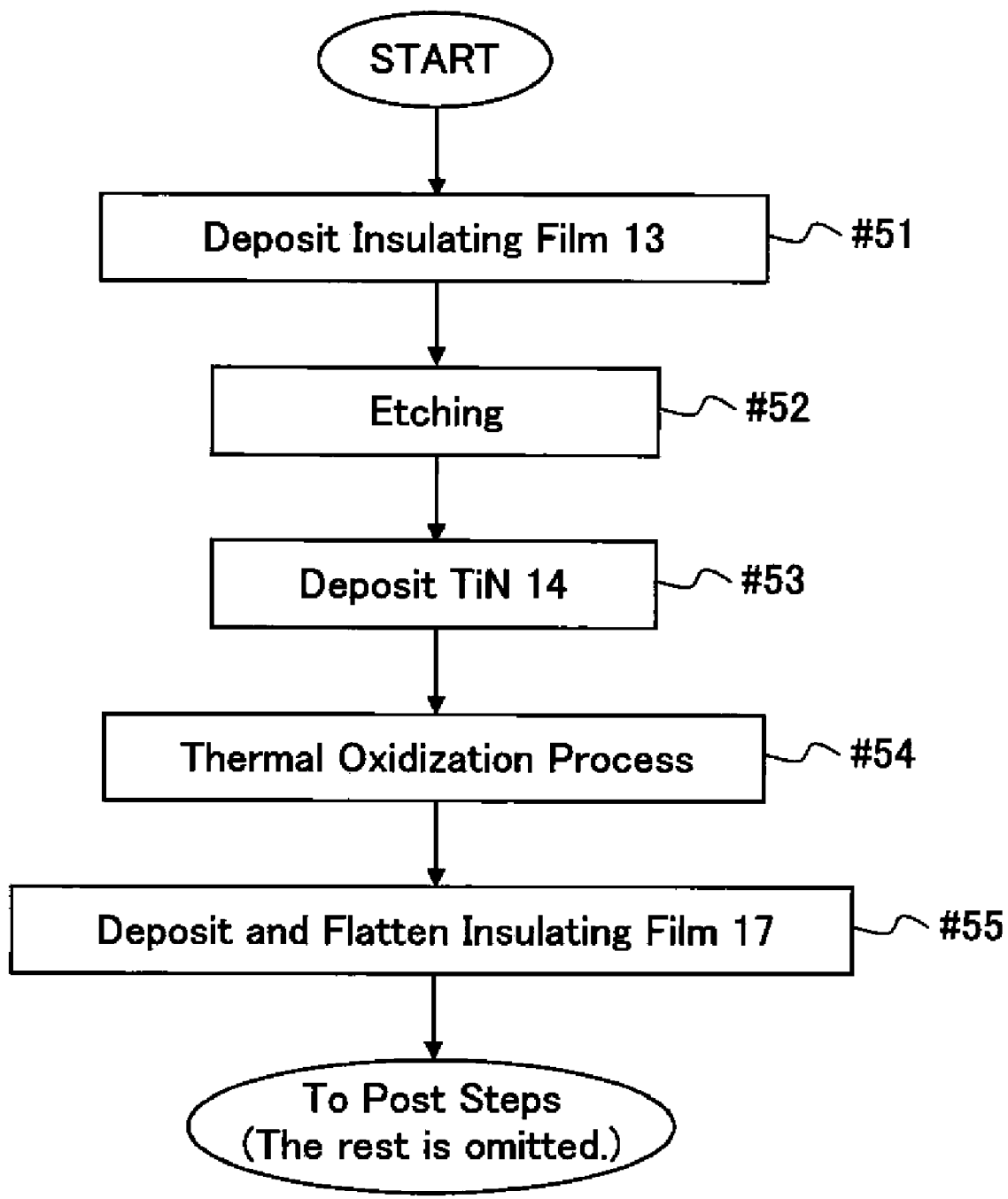
FIG. 15 is a flow chart showing the manufacturing steps in the manufacturing method for a variable resistive element according to the fifth embodiment of the present invention.
Figure 17:
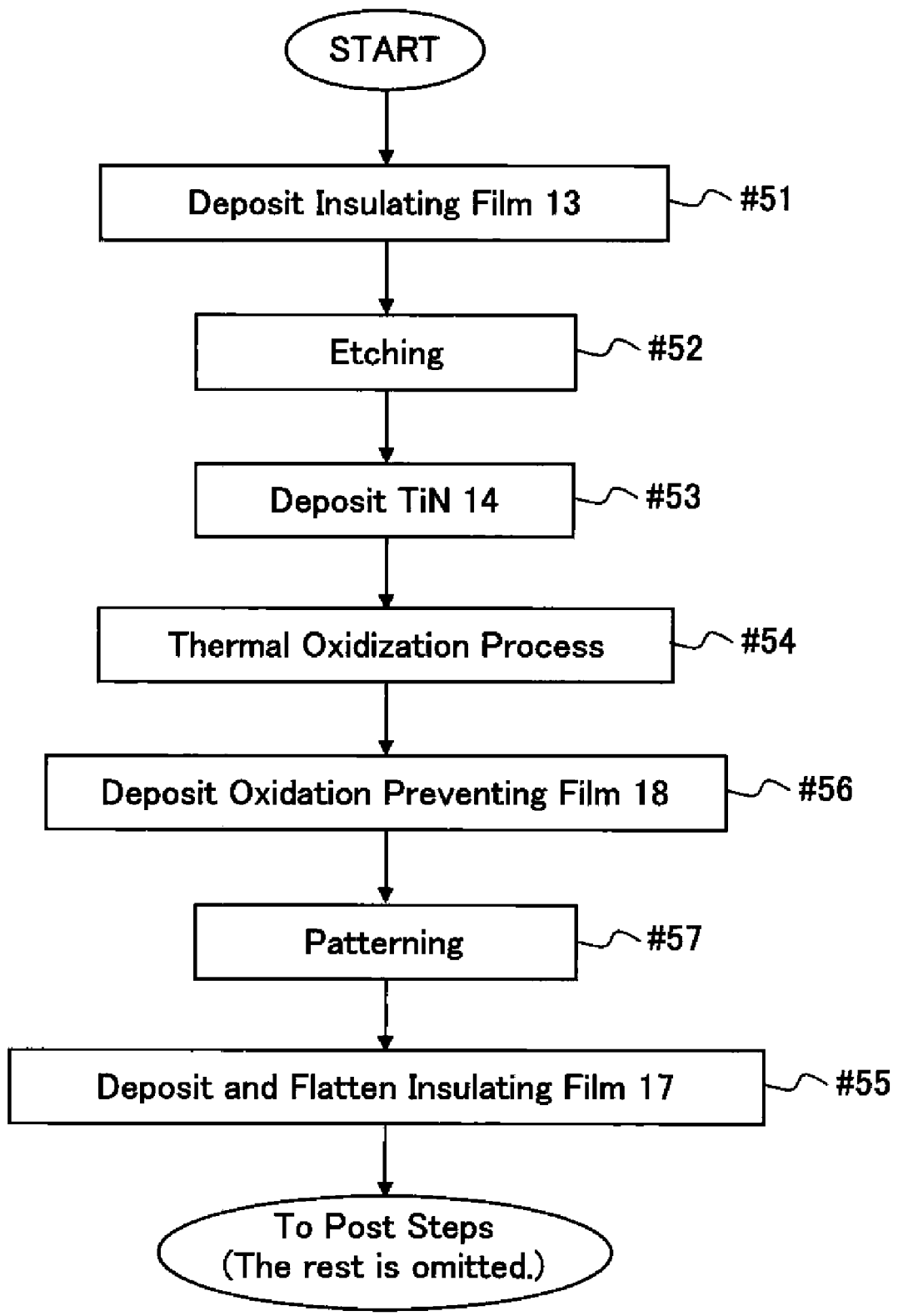
FIG. 17 is a flow chart showing the manufacturing steps in the manufacturing method for a variable resistive element according to another version of the fifth embodiment of the present invention.

First, as shown in FIG. 14A, an SiO$_2$ film (first interlayer insulating film) 13 is deposited on the entire surface of a semiconductor substrate 11 where an appropriate transistor circuit (not shown) and appropriate metal wirings 21 are formed in accordance with a CVD method so as to have a thickness of 300 nm (Step #61). Here, the present embodiment, unlike the third and fourth embodiments, is applied to a case where a metal wiring 21 having a predetermined film thickness protrudes from the top of the semiconductor substrate 11. At this time, it is desirable to use a plasma CVD method having poor step coverage as the method for forming a first interlayer insulating film 13. As a result, a step portion 41 of the first interlayer insulating film 13 is formed around the location where the metal wiring 21 is formed in a reverse tapered form where the first interlayer insulating film 13 protrudes more to the outside toward the upper region.

Figure 14B:
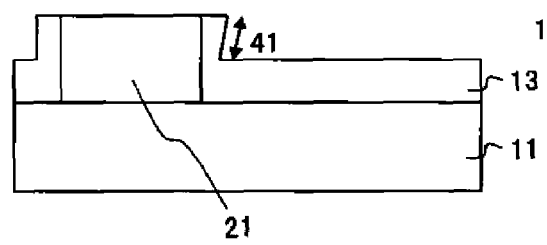

Next, as shown in FIG. 14B, the upper surface of the metal wiring 21 is exposed in accordance with a well-known etching technology using a resist formed in accordance with a well-known photolithographic technology as a mask (Step #52). In this case as well, a step portion 41 is formed.

Figure 14C:
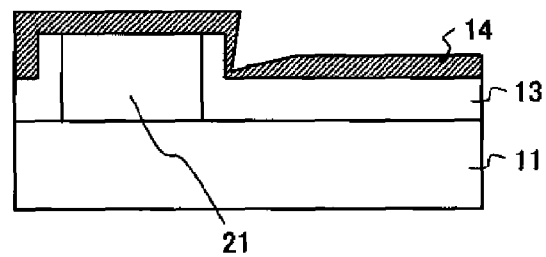

Next, as shown in FIG. 14C, a TiN film 14, which is an example of a conductive thin film, is deposited on the entire surface of the semiconductor substrate 11 in accordance with a sputtering method so as to have a thickness of 60 nm (Step #53). At this time, the step portion 41 is in reverse tapered form as described above, therefore, the TiN film 14 can be formed in such a manner that the film thickness becomes smaller from the top to the bottom of the step portion 41, and in the same manner as in the third and fourth embodiments, a local thin film region where the film thickness is smaller than the other region within the TiN film 14 can be formed.

Figure 14D:
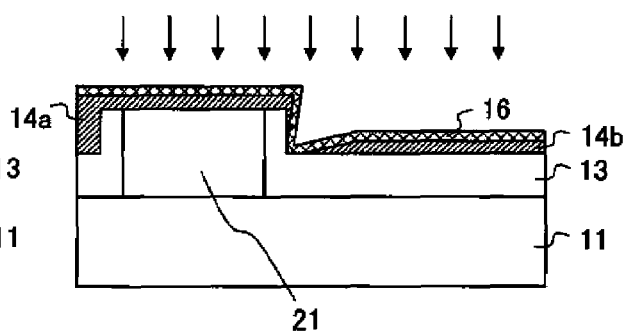

Next, as shown in FIG. 14D, the TiN film 14 is oxidized through thermal oxidation, for example, in an atmosphere which includes oxygen at 250° C. to 450° C., so that a $TiO_2$ film 16 which is an example of a variable resistor (hereinafter referred to as "variable resistor film 16") is formed (Step #54). At this time, thermal oxidation is carried out so as to reach from the surface of the TiN film 14 deposited in the outer wall portion of the step portion 41 to the interface between the first interlayer insulating film 13 and the TiN film 14 (in other words, the TiN film 14 in at least the local thin film region is oxidized through the film thickness of the local thin film region), and as a result, the TiN film 14 on the outer wall portion of the step portion 41 is converted to a variable resistor film 16. At this time, the oxidation process is carried out under predetermined conditions in terms of pressure, temperature and time for processing, and thus, the TiN film 14 formed in the upper region which makes contact with the metal wiring 21 is not completely oxidized so that a partially unoxidized TiN film 14 remains. In this Step #54, the TiN film 14 is divided by the variable resistor film 16 into an electrode (first electrode) 14a which makes contact with the metal wiring 21 and an electrode made of the other part (second electrode) 14b. Here, in the same manner as in the third embodiment, the thermal oxidation process may be carried out under the conditions of normal pressure (760 Torr) and 300° C. for approximately 40 minutes.

Figure 14E:
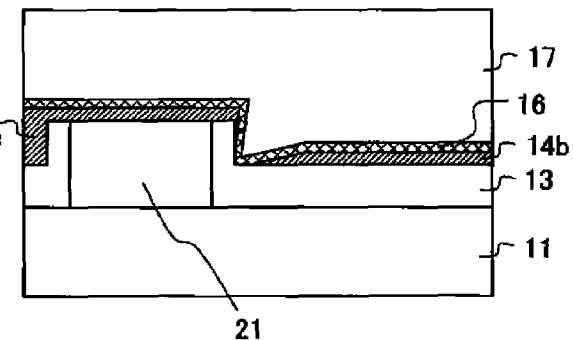

Next, as shown in FIG. 14E, a protective interlayer insulating film 17, such as of $SiO_2$, is deposited in accordance with a CVD method so as to have a thickness of 700 nm and flattened in accordance with a flattening technology, such as a well-known CMP method (Step #55).

In the present embodiment, in the same manner as in the first to fourth embodiments, a variable resistor film 16 is formed by oxidizing the TiN film 14. In addition, as a result of the formation of the variable resistor film 16, the TiN film 14 is divided into two portions (first electrode 14a and second electrode 14b), and as a result, a variable resistive element where a variable resistor 16 is sandwiched between the two electrodes is formed. Accordingly, the interfaces between the two electrodes 14a and 14b and the variable resistor film 16 are not exposed to a gas or air, therefore, unlike conventional methods, there is no inconsistency in the contact resistance by being affected by an atmosphere in the process for film formation, and thus, contact resistance can be stabilized and consistent between memory cells within the same wafer and between different wafers. As a result, the voltage applied across the two ends of the variable resistor film 16 can be made uniform, and a variable resistive element having a stable switching operation can be formed with excellent reproducibility.

Here, in the case where a patterning process is carried out on the TiN film 14 (14a, 14b) and the variable resistor film 16 in the present embodiment, in the same manner as in the third and fourth embodiments, it is preferable to form a predetermined oxidation preventing insulating film in advance before carrying out a patterning process.

FIGS. 16A to 16G and 17 are schematic cross sectional diagrams and a flow chart of another manufacturing process in the present embodiment. As shown in FIG. 16E, after the completion of the thermal oxidation process (Step #54), an oxidation preventing insulating film 18, such as of SiON, SiN, SiOC or SiC, is deposited in accordance with a CVD method so as to have a thickness of approximately 50 nm (Step #56).

After that, as shown in FIG. 16F, the oxidation preventing insulating film 18, the variable resistor film 16 and the TiN film 14 (14a, 14b) are patterned in accordance with a well-known etching technology using a resist formed in accordance with a well-known photolithographic technology as a mask (Step #57). After that, as shown in FIG. 16G, in the same manner as in FIG. 9G, a protective interlayer insulating film 17 is deposited and a flattening process is carried out (Step #55).

As described above, the oxidation preventing insulating film 18 is formed in advance before the patterning process in Step #57, and thus, the variable resistor film 16 can be prevented from being affected by the oxidation in the patterning process, for example, that of the resist ashing process, so that a variable resistive element can be manufactured without deteriorating the properties of the above described variable resistor.

SIXTH EMBODIMENT

The method according to the sixth embodiment of the present invention (hereinafter referred to as "present embodiment") is described below in reference to FIGS. 18A to 21. FIGS. 18A to 18F are schematic cross sectional diagrams showing the respective steps at the time of the manufacture of a semiconductor device in the present embodiment, and FIGS. 18A to 18F show the individual steps. In addition, FIG. 19 is a flow chart showing the manufacturing steps in the present embodiment, and each step in the following shows each step in the flow chart shown in FIG. 18.

Figure 18A:
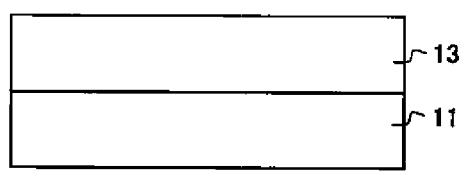
FIGS. 18A to 18F are cross sectional diagrams schematically illustrating the manufacturing steps in the manufacturing method for a variable resistive element according to the sixth embodiment of the present invention.
Figure 19:
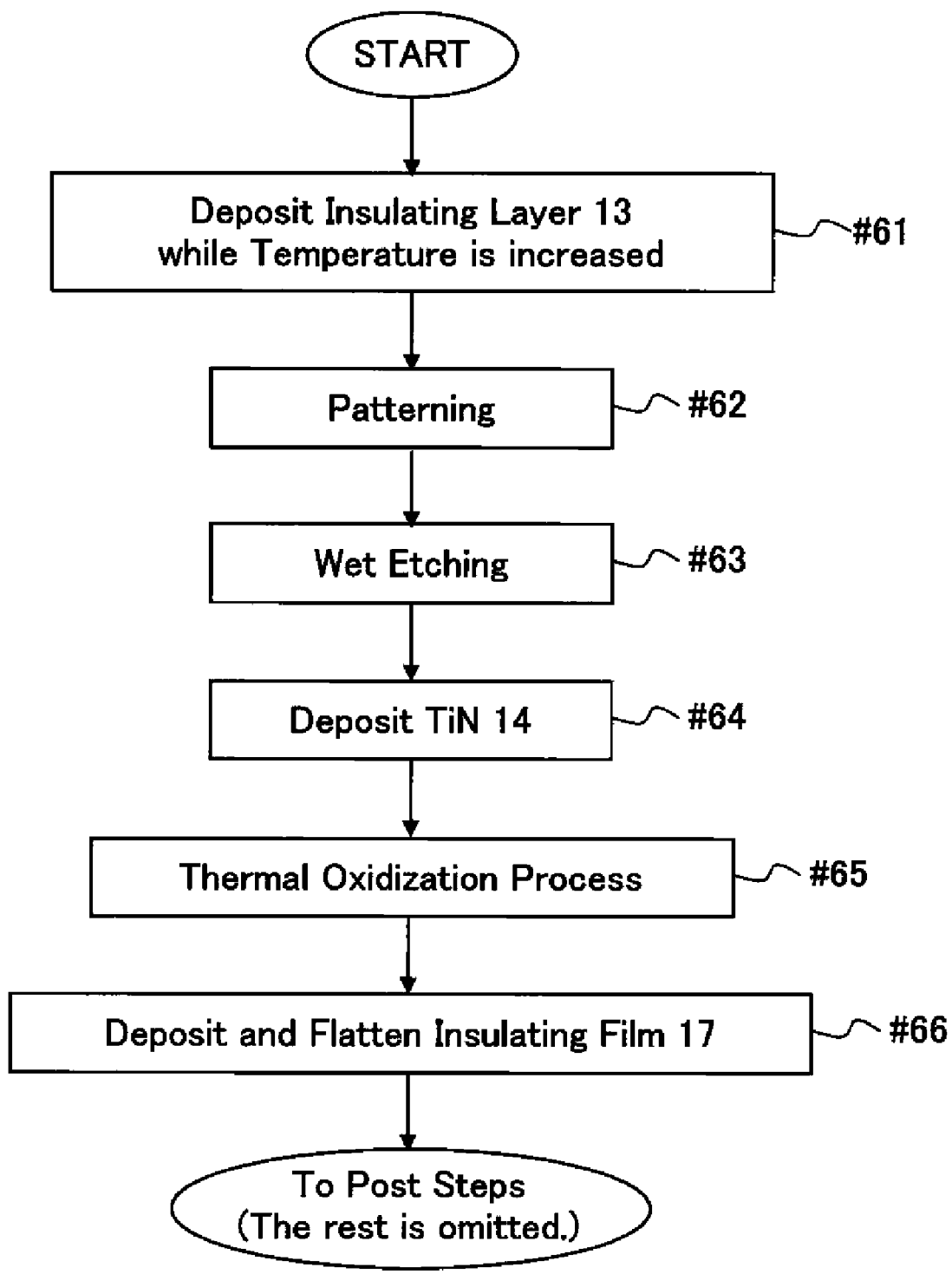
FIG. 19 is a flow chart showing the manufacturing steps in the manufacturing method for a variable resistive element according to the sixth embodiment of the present invention.

First, as shown in FIG. 18A, an $SiO_2$ film (first interlayer insulating film) 13 is deposited on the entire surface of a semiconductor substrate 11 where an appropriate transistor circuit (not shown) is formed in accordance with a CVD method where the temperature of the substrate is raised from 200° C. to approximately 400° C. so as to have a thickness of 400 nm (Step #61). The growth rate of the first interlayer insulating film 13 is affected by the temperature of the substrate when formed on the semiconductor substrate 11, therefore, the film quality of the first interlayer insulating film 13 sequentially changes from a coarse state to a dense state from the semiconductor substrate 11 side toward the top.

Figure 18D:
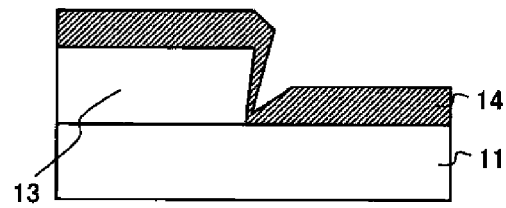
Figure 18B:
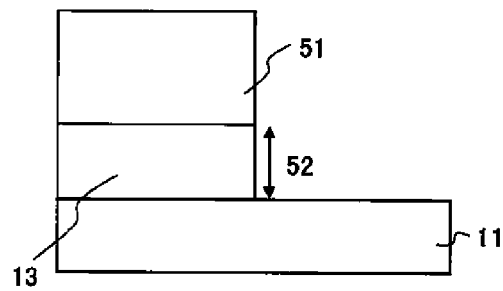

Next, as shown in FIG. 18B, the first interlayer insulating film 13 is patterned in accordance with a well-known etching technology using a resist (resist film 51) formed in accordance with a well-known photolithographic technology as a mask so that a step portion 52 is formed (Step #62).

Figure 18E:
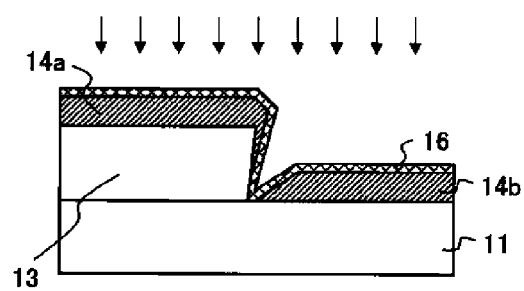
Figure 18C:
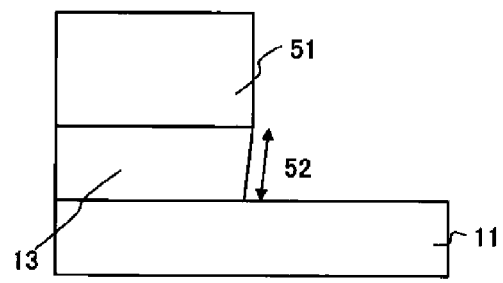

Next, as shown in FIG. 18C, wet etching is carried out using a chemical, such as HF, in the state where the resist film 51 is not removed through ashing (Step #63). At this time, the density of the first interlayer insulating film 13 is lower toward the bottom as a result of the process in Step #61, therefore, the step portion 52 is processed to a reverse tapered form because the faster the etching progresses, the lower the film density is in the region.

Next, as shown in FIG. 18D, after the removal of the resist film 51, a TiN film 14, which is an example of a conductive thin film, is formed on the entire surface of the semiconductor substrate 11 in accordance with a sputtering method so as to have a thickness of 60 nm (Step #64). At this time, the step portion 52 has a reverse tapered form, therefore, the TiN film 14 can be formed in such a manner that the film thickness sequentially becomes smaller from the top to the bottom of the step portion 52, and in the same manner as in the third to fifth embodiments, a local thin film region where the film thickness is smaller than the other regions can be formed within the TiN film 14.

Next, as shown in FIG. 18E, the TiN film 14 is oxidized through thermal oxidation, for example, in an atmosphere which includes oxygen at 250° C. to 450° C., so that a TiO$_2$ film 16, which is an example of a variable resistor, is formed (Step #65). At this time, thermal oxidation is carried out so as to reach from the surface of the TiN film 14 deposited in the outer wall portion of the step portion 52 to the interface between the first interlayer insulating film 13 and the TiN film 14 and to the interface between the semiconductor substrate 11 and the TiN film 14 (in other words, the TiN film 14 in at least the local thin film region is oxidized through the film thickness of the local thin film region), and as a result, the TiN film 14 on the outer wall portion of the step portion 52 is converted to a variable resistor film 16. At this time, in the same manner as in the fifth embodiment, the oxidation process is carried out under predetermined conditions in terms of pressure, temperature and time for processing, and thus, the TiN film 14 formed on the upper surface of the first interlayer insulating film 13, which is the upper portion of the step portion 52, and the TiN film 14 formed on the upper surface of the semiconductor substrate 11, which is the lower portion of the step portion 52, are not completely oxidized so that partially unoxidized TiN films 14 remain in these regions. In this Step #65, the TiN film 14 is divided by the variable resistor film 16 into an electrode (first electrode) 14a formed in the upper portion of the step portion 52 (on upper surface of first interlayer insulating film 13) and an electrode (second electrode) 14b formed in the lower portion of the step portion 52 (on upper surface of semiconductor substrate 11). Here, in the same manner as in the third embodiment, the thermal oxidation process may be carried out under the conditions of normal pressure (760 Torr) and 300° C. for approximately 40 minutes.

Figure 18F:
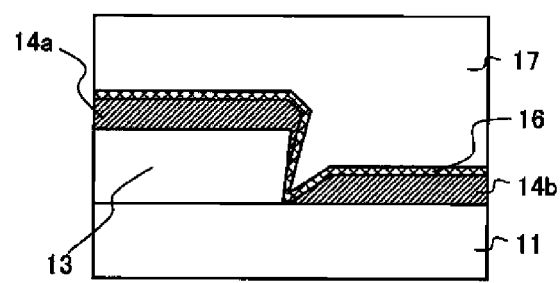

Next, as shown in FIG. 18F, a protective interlayer insulating film 17, such as of SiO$_2$, is deposited in accordance with a CVD method so as to have a thickness of 700 nm and flattened in accordance with a flattening technology, such as a well-known CMP method (Step #67).

In the present embodiment, in the same manner as in the first to fifth embodiments, a variable resistor film 16 is formed by oxidizing the TiN film 14. In addition, as a result of the formation of the variable resistor film 16, the TiN film 14 is divided into two portions (first electrode 14a and second electrode 14b), and as a result, a variable resistive element where a variable resistor 16 is sandwiched between the two electrodes is formed. Accordingly, the interfaces between the two electrodes 14a and 14b and the variable resistor film 16 are not exposed to a gas or air, therefore, unlike conventional methods, there is no inconsistency in the contact resistance by being affected by an atmosphere in the process for film formation, and thus, contact resistance can be stabilized and consistent between memory cells within the same wafer and between different wafers. As a result, the voltage applied across the two ends of the variable resistor film 16 can be made uniform, and a variable resistive element having a stable switching operation can be formed with excellent reproducibility.

Here, in the case where a patterning process is carried out on the TiN film 14 (14a, 14b) and the variable resistor film 16 in the present embodiment, in the same manner as in the third to fifth embodiments, it is preferable to form a predetermined oxidation preventing insulating film in advance before carrying out a patterning process.

Figure 20A:
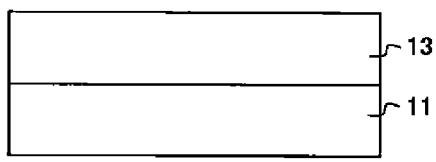
FIGS. 20A to 20H are cross sectional diagrams schematically illustrating the manufacturing steps in the manufacturing method for a variable resistive element according to another version of the sixth embodiment of the present invention.
Figure 20D:
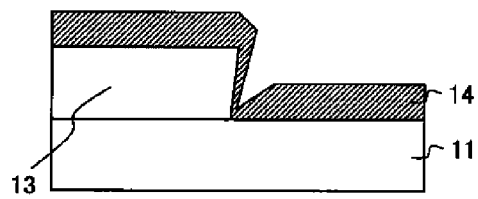
Figure 20B:
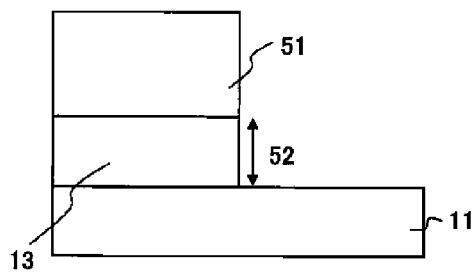
Figure 20E:
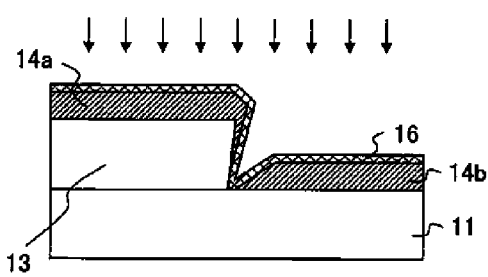
Figure 20C:
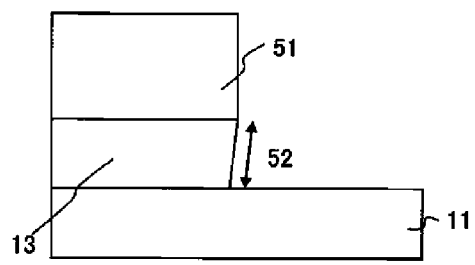
Figure 20F:
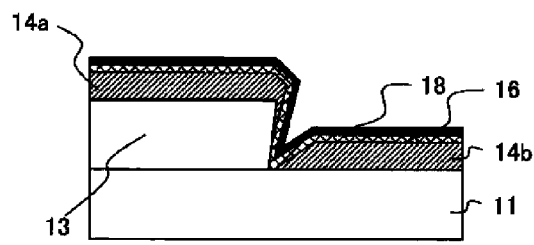
Figure 20G:
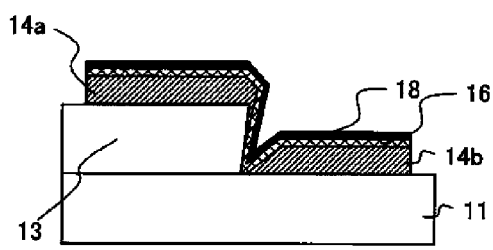
Figure 20H:
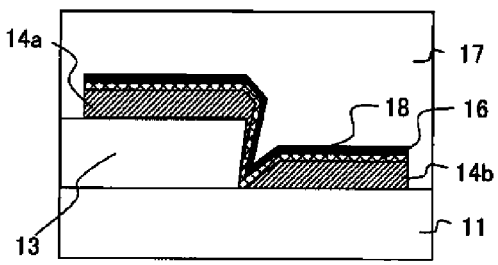
Figure 21:
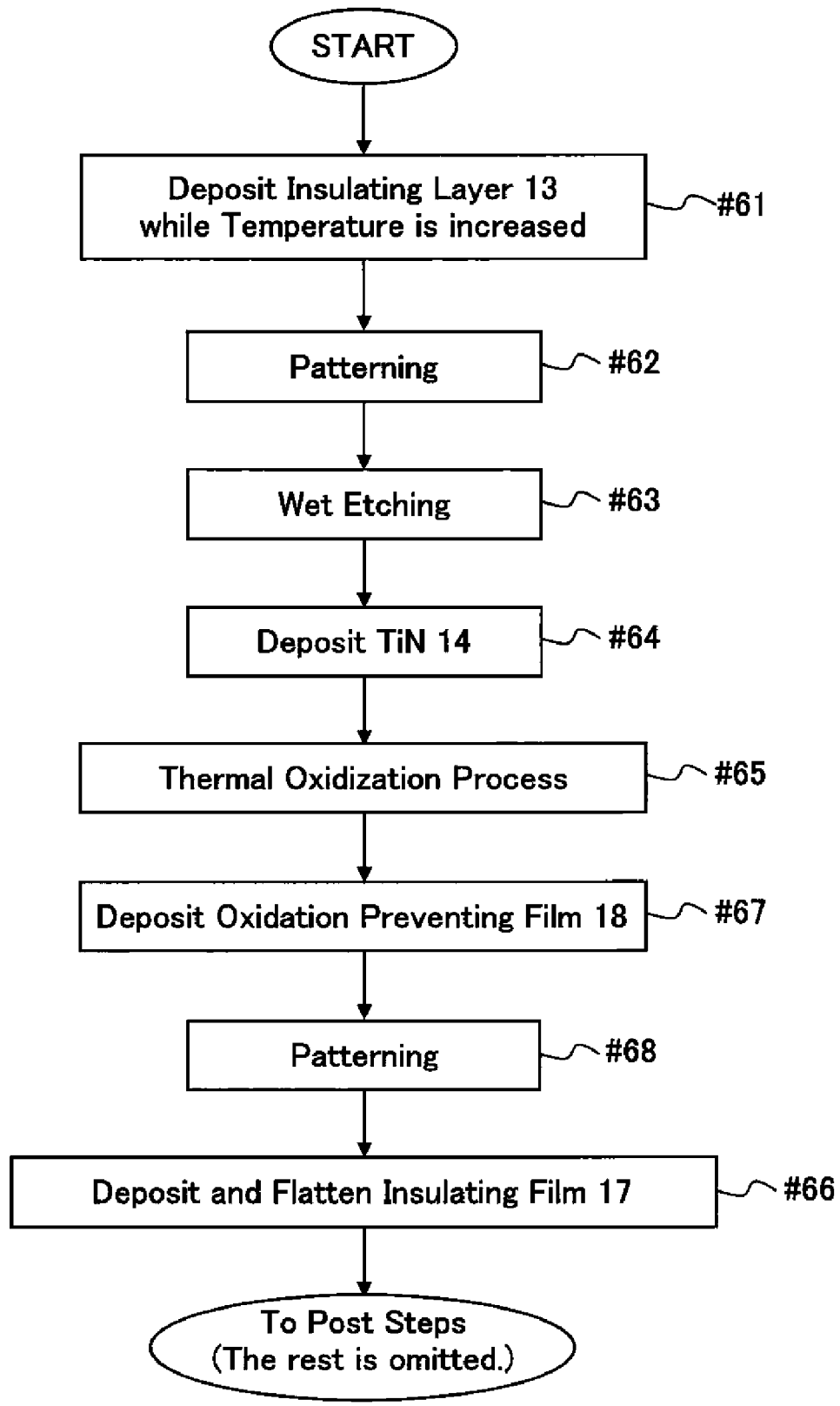
FIG. 21 is a flow chart showing the manufacturing steps in the manufacturing method for a variable resistive element according to another version of the sixth embodiment of the present invention.

FIGS. 20A to 20H and 21 are schematic cross sectional diagrams and a flow chart of another manufacturing process in the present embodiment. As shown in FIG. 20F, after the completion of the thermal oxidation process (Step #65), an oxidation preventing insulating film 18, such as of SiON, SiN, SiOC or SiC, is deposited in accordance with a CVD method so as to have a thickness of approximately 50 nm (Step #67). After that, as shown in FIG. 20G, the oxidation preventing insulating film 18, the variable resistor film 16 and the TiN film 14 (14a, 14b) are patterned in accordance with a well-known etching technology using a resist formed in accordance with a well-known photolithographic technology as a mask (Step #68). After that, as shown in FIG. 20G, in the same manner as in FIG. 18F, a protective interlayer insulating film 17 is deposited and a flattening process is carried out (Step #66).

As described above, the oxidation preventing insulating film 18 is formed in advance before the patterning process in Step #68, and thus, the variable resistor film 16 can be prevented from being affected by the oxidation in the patterning process, for example, that of the resist ashing process, so that a variable resistive element can be manufactured without deteriorating the properties of the above described variable resistor.

SEVENTH EMBODIMENT

The method according to the seventh embodiment of the present invention (hereinafter referred to as "present embodiment") is described below in reference to FIGS. 22A to 25. FIGS. 22A to 22F are schematic cross sectional diagrams showing the respective steps at the time of the manufacture of a semiconductor device in the present embodiment, and FIGS. 22A to 22F show the individual steps. In addition, FIG. 23 is a flow chart showing the manufacturing steps in the present embodiment, and each step in the following shows each step in the flow chart shown in FIG. 23.

Figure 22A:
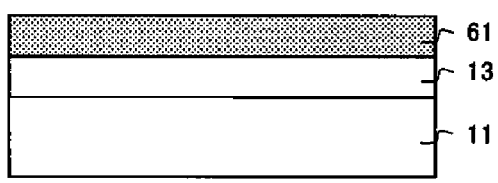
FIGS. 22A to 22F are cross sectional diagrams schematically illustrating the manufacturing steps in the manufacturing method for a variable resistive element according to the seventh embodiment of the present invention.
Figure 23:
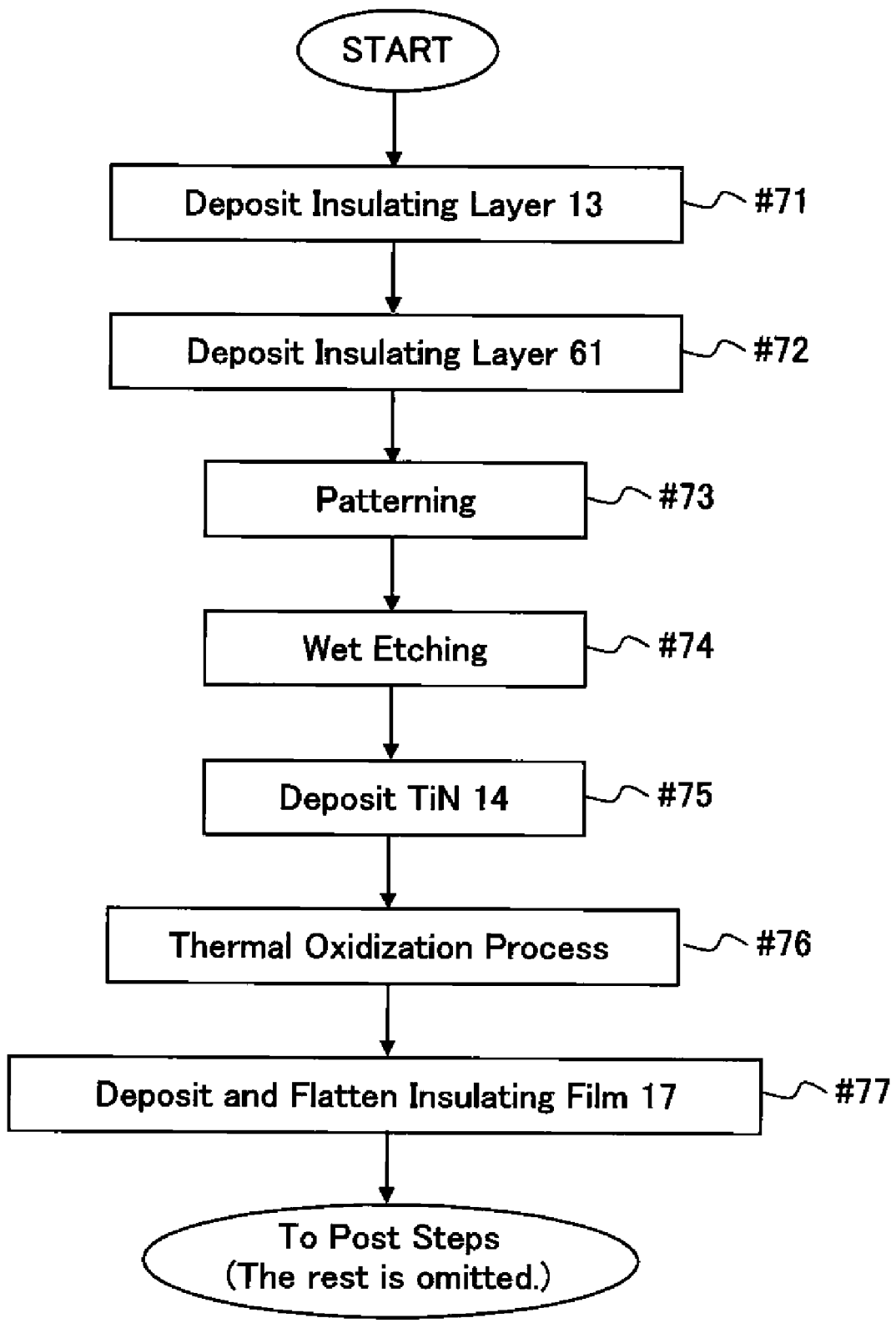
FIG. 23 is a flow chart showing the manufacturing steps in the manufacturing method for a variable resistive element according to the seventh embodiment of the present invention.

First, as shown in FIG. 22A, an SiO$_2$ film (first interlayer insulating film) 13 is deposited on the entire surface of a semiconductor substrate 11 where an appropriate transistor circuit (not shown) is formed in accordance with a CVD method so as to have a thickness of 200 nm (Step #71), and furthermore, an SiN film (second interlayer insulating film) 61 is deposited on the entirety of the upper surface of the first interlayer insulating film 13 in accordance with a CVD method so as to have a thickness of 200 nm (Step #72).

Figure 22B:
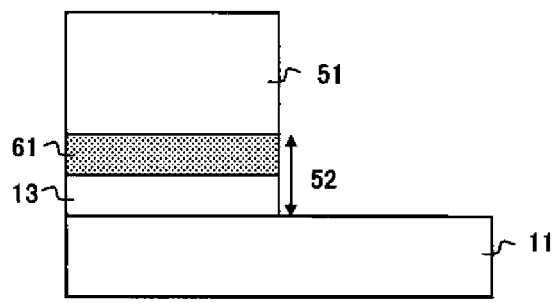

Next, as shown in FIG. 22B, the first interlayer insulating film 13 and the second interlayer insulating film 61 are patterned in accordance with a well-known etching technology using a resist (resist film 51) formed in accordance with a well-known photolithographic technology as a mask so that a step portion 62 is formed (Step #73).

Figure 22C:
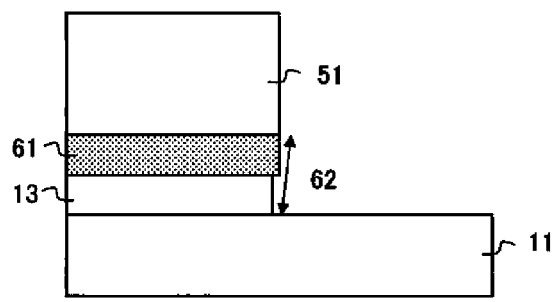

Next, as shown in FIG. 22C, wet etching is carried out using a chemical, such as HF, in the state where the resist film 51 is not removed through ashing (Step #74). At this time, the wet etch rate of SiO$_2$, which is the material of the first interlayer insulating film 13, is higher than that of SiN, which is the material of the second interlayer insulating film 61, therefore, the first interlayer insulating film 13 is etched and removed more than the second interlayer insulating film 61, and as a result, the step portion 62 is processed to a reverse step form where the second interlayer insulating film 61 in the upper layer protrudes more to the outside than the first interlayer insulating film 13 in the lower layer.

Figure 22D:
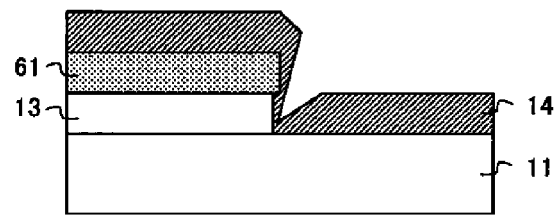

Next, as shown in FIG. 22D, after the removal of the resist film 51, a TiN film 14, which is an example of a conductive thin film, is formed on the entire surface of the semiconductor substrate 11 in accordance with a sputtering method so as to have a thickness of 60 nm (Step #75). At this time, the step portion 62 has a reverse step form, therefore, the films can be formed such that the thickness of the TiN film 14 deposited on the outside of the lower layer portion of the step portion 62 (sidewall of first interlayer insulating film 13) is smaller than the thickness of the TiN film 14 deposited on the outside of the upper layer portion of the step portion 62 (sidewall of second interlayer insulating film 61), and in the same manner as in the third to sixth embodiments, a local thin film region where the film thickness is smaller than the other regions can be formed within the TiN film 14.

Figure 22E:
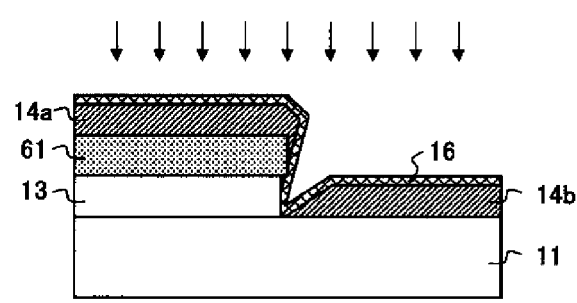

Next, as shown in FIG. 22E, the TiN film 14 is oxidized through thermal oxidation, for example, in an atmosphere which includes oxygen at 250° C. to 450° C., so that a $TiO_2$ film 16, which is an example of a variable resistor, is formed (Step #76). At this time, thermal oxidation is carried out so as to reach from the surface of the TiN film 14 deposited in the outer wall portion of the step portion 62 to the interface between the first interlayer insulating film 13 or the second interlayer insulating film 61 and the TiN film 14 and to the interface between the semiconductor substrate 11 and the TiN film 14 (in other words, the TiN film 14 in at least the local thin film region is oxidized through the film thickness of the local thin film region), and as a result, the TiN film 14 on the outer wall portion of the step portion 62 is converted to a variable resistor film 16. At this time, the oxidation process is carried out under predetermined conditions in terms of pressure, temperature and time for processing, and thus, the TiN film 14 formed on the upper surface of the second interlayer insulating film 61, which is the upper portion of the step portion 62, and the TiN film 14 formed on the upper surface of the semiconductor substrate 11, which is the lower portion of the step portion 62, are not completely oxidized so that partially unoxidized TiN films 14 remain in these regions. In this Step #76, the TiN film 14 is divided by the variable resistor film 16 into an electrode (first electrode) 14a formed in the upper portion of the step portion 62 (on upper surface of second interlayer insulating film 61) and an electrode (second electrode) 14b formed in the lower portion of the step portion 62 (on upper surface of semiconductor substrate 11). Here, in the same manner as in the third embodiment, the thermal oxidation process may be carried out under the conditions of normal pressure (760 Torr) and 300° C. for approximately 40 minutes.

Figure 22F:
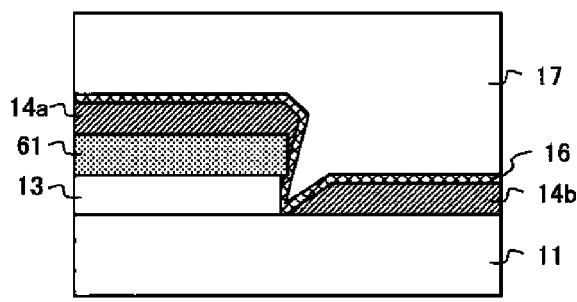

Next, as shown in FIG. 22F, a protective interlayer insulating film 17, such as of $SiO_2$, is deposited in accordance with a CVD method so as to have a thickness of 700 nm and flattened in accordance with a flattening technology, such as a well-known CMP method (Step #77).

In the present embodiment, in the same manner as in the first to sixth embodiments, a variable resistor film 16 is formed by oxidizing the TiN film 14. In addition, as a result of the formation of the variable resistor film 16, the TiN film 14 is divided into two portions (first electrode 14a and second electrode 14b), and as a result, a variable resistive element where a variable resistor 16 is sandwiched between the two electrodes is formed. Accordingly, the interfaces between the two electrodes 14a and 14b and the variable resistor film 16 are not exposed to a gas or air, therefore, unlike conventional methods, there is no inconsistency in the contact resistance by being affected by an atmosphere in the process for film formation, and thus, contact resistance can be stabilized and consistent between memory cells within the same wafer and between different wafers. As a result, the voltage applied across the two ends of the variable resistor film 16 can be made uniform, and a variable resistive element having a stable switching operation can be formed with excellent reproducibility.

Here, in the case where a patterning process is carried out on the TiN film 14 (14a, 14b) and the variable resistor film 16 in the present embodiment, in the same manner as in the third to sixth embodiments, it is preferable to form a predetermined oxidation preventing insulating film in advance before carrying out a patterning process.

Figure 24A:
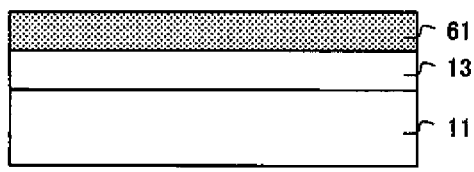
FIGS. 24A to 24H are cross sectional diagrams schematically illustrating the manufacturing steps in the manufacturing method for a variable resistive element according to another version of the seventh embodiment of the present invention.
Figure 24D:
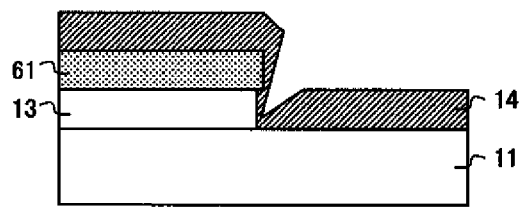
Figure 24B:
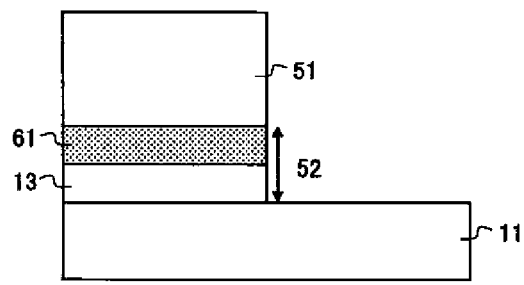
Figure 24E:
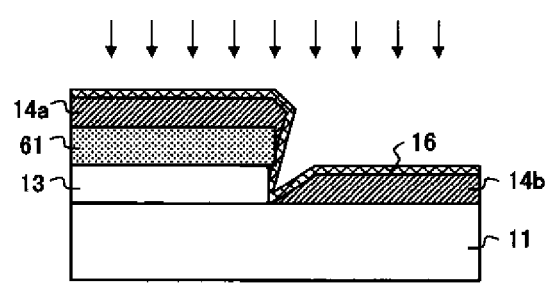
Figure 24C:
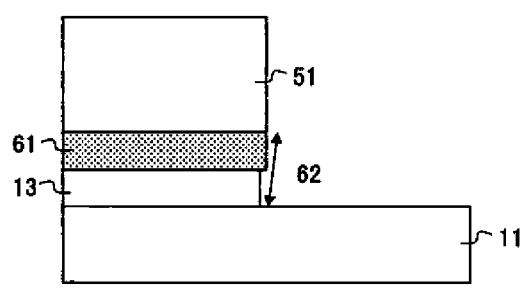
Figure 24F:
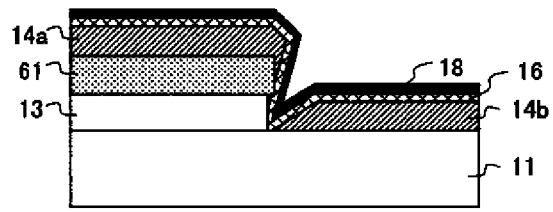
Figure 24G:
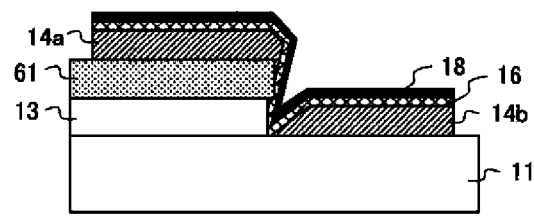
Figure 24H:
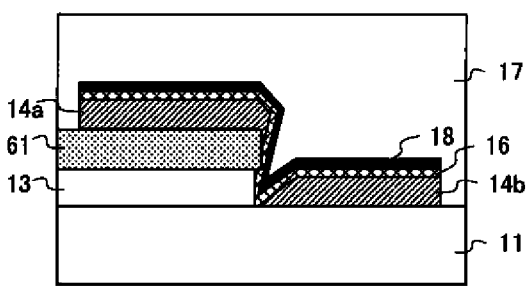
Figure 25:
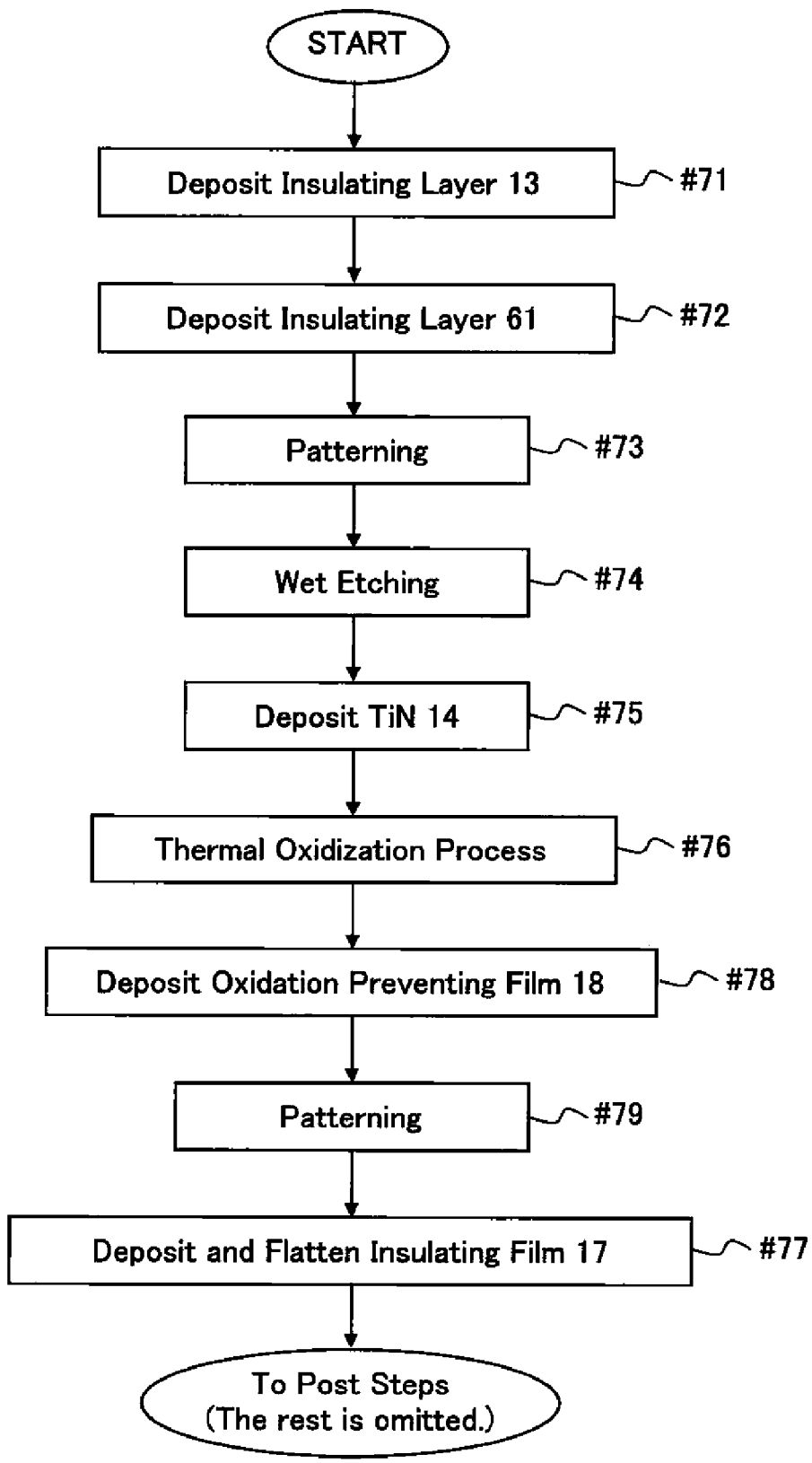
FIG. 25 is a flow chart showing the manufacturing steps in the manufacturing method for a variable resistive element according to another version of the seventh embodiment of the present invention.
Figure 26:
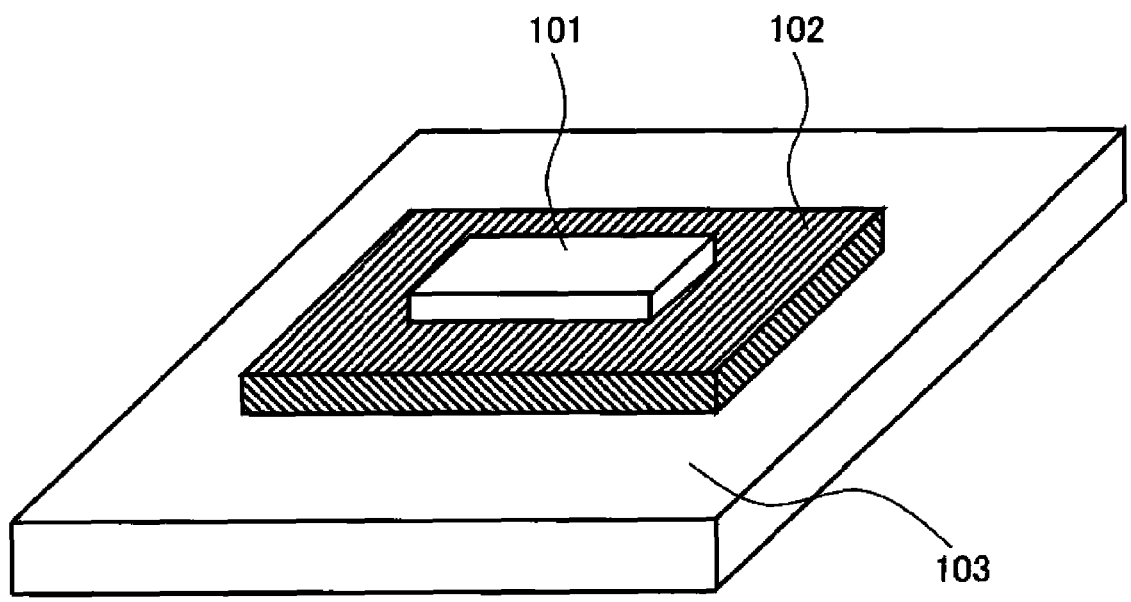
FIG. 26 is a schematic diagram showing the structure of a variable resistive element having a conventional configuration.
Figure 27:
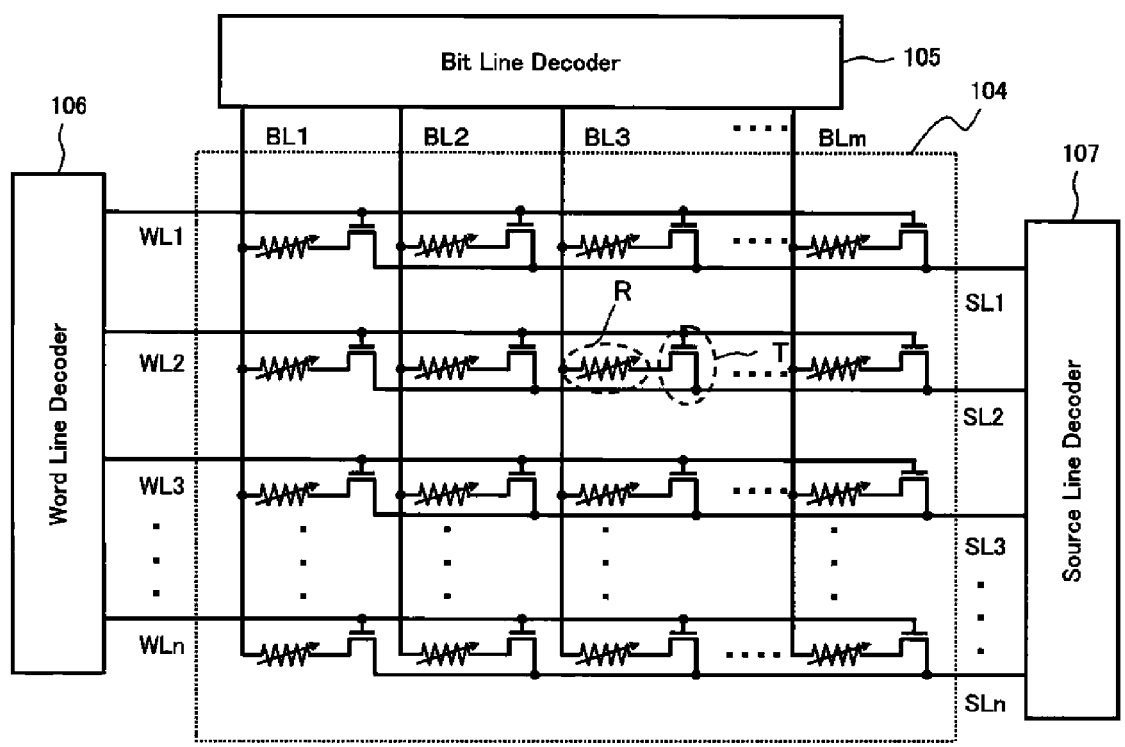
FIG. 27 is an equivalent circuit diagram showing an example of the configuration of a 1T/1R type memory cell.
Figure 28:
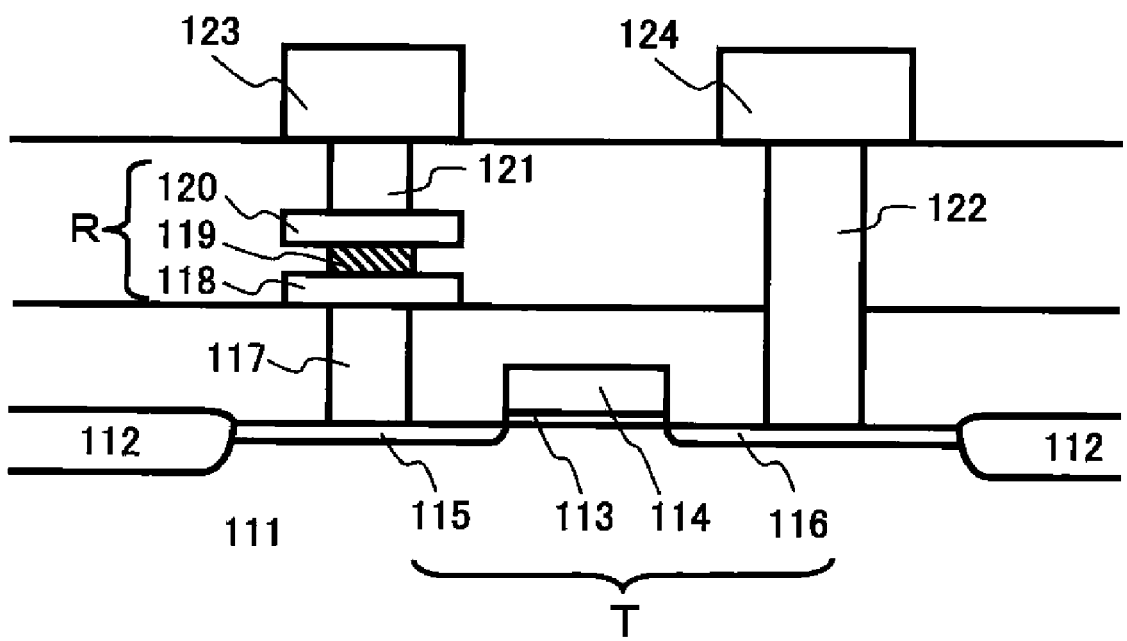
FIG. 28 is a schematic cross sectional diagram showing a 1T/1R type memory cell.
Figure 29:
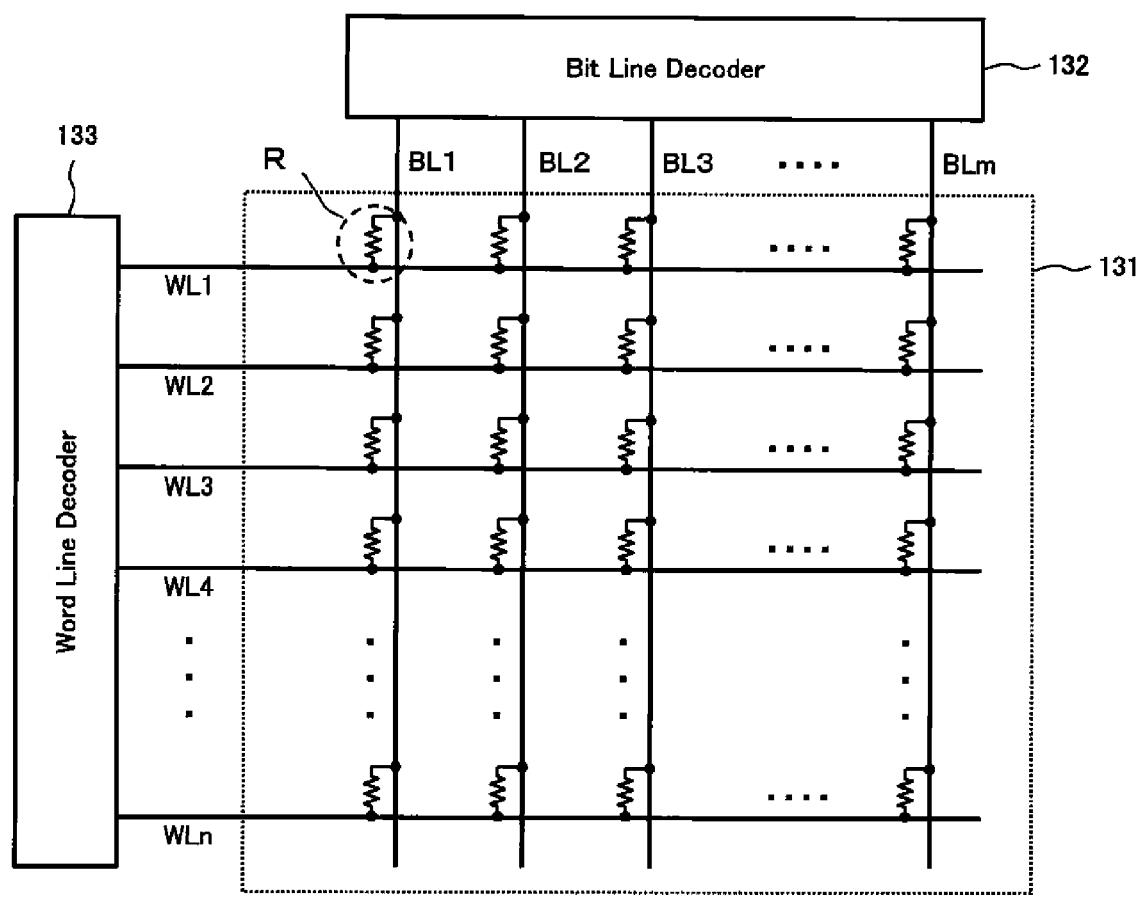
FIG. 29 is an equivalent circuit diagram showing an example of the configuration of a 1R type memory cell.
Figure 30:
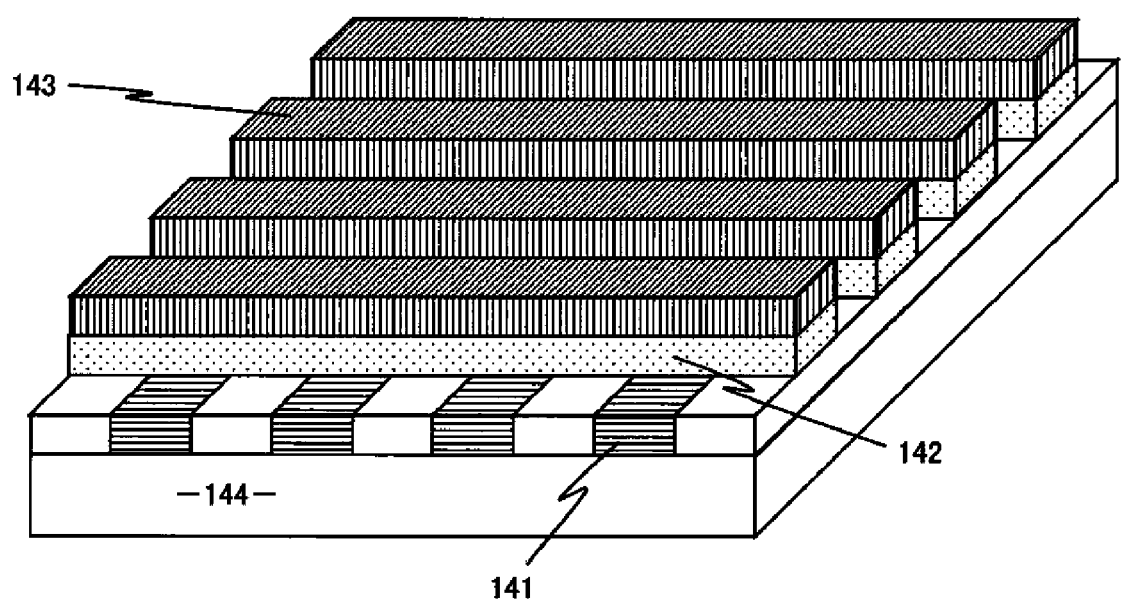
FIG. 30 is a schematic cross sectional diagram showing a 1R type memory cell.

FIGS. 24A to 24H and 25 are schematic cross sectional diagrams and a flow chart of another manufacturing process in the present embodiment. As shown in FIG. 24F, after the completion of the thermal oxidation process (Step #76), an oxidation preventing insulating film 18, such as of SiON, SiN, SiOC or SiC, is deposited in accordance with a CVD method so as to have a thickness of approximately 50 nm (Step #78). After that, as shown in FIG. 24G, the oxidation preventing insulating film 18, the variable resistor film 16 and the TiN film 14 (14a, 14b) are patterned in accordance with a well-known etching technology using a resist formed in accordance with a well-known photolithographic technology as a mask (Step #79). After that, as shown in FIG. 24H, in the same manner as in FIG. 22F, a protective interlayer insulating film 17 is deposited and a flattening process is carried out (Step #77).

As described above, the oxidation preventing insulating film 18 is formed in advance before the patterning process in Step #79, and thus, the variable resistor film 16 can be prevented from being affected by the oxidation in the patterning process, for example, that of the resist ashing process, so that a variable resistive element can be manufactured without deteriorating the properties of the above described variable resistor.

Here, the process for depositing a TiN film 14 in the above described first and second embodiments (Steps #11, #23) is not limited to a sputtering method, and any appropriate deposition technology, including pulse laser deposition, e-beam vapor deposition, thermal vapor deposition, organic metal deposition, spin-on deposition and organic metal chemical vapor deposition, may be used for deposition.

Meanwhile, in the process for depositing a TiN film 14 in the above described third to seventh embodiments (Steps #33, #45, #53, #64 and #75), it is preferable to use a directional sputtering film growth method, including collimate sputtering, long-slow sputtering and ion sputtering, for deposition in order to differentiate between the film thickness of the TiN film 14 as the two electrodes (first electrode 14a, second electrode 14b) and the film thickness of the local thin film region for forming the variable resistor 16 (in order to make the film thickness of the TiN film 14 deposited in the local thin film region sufficiently thinner than the film thickness of the two electrodes). Furthermore, it is also possible to control the film thickness of the variable resistor 16 by layering the films formed by a CVD method and formed by a sputtering method.

In addition, as for the process for oxidation in the above described respective embodiments (Steps #16, #26, #34, #46, #54, #65 and #76), a plasma oxidation method or an ion implantation method, in addition to a thermal oxidation method using molecules which include oxygen, such as $O_2$, $O_3$, $H_2O$, $N_2O$ or NO, as gaseous species, may be used.

In addition, though the variable resistor film 16 is a $TiO_2$ film in the above described respective embodiments, it is also possible to provide a $TiO_{2-X}N_X$ film having variable resistive properties by appropriately adjusting the conditions for oxidation, such as the temperature for oxidation, the concentration of oxidation and the like. Furthermore, though the conductive thin film 14 is a TiN film, it is also possible to form the conductive thin film 14 of a transition metal, such as Cu, Ni, V, Zn, Nb, Ti, W or Co, or a nitride of a transition metal. At this time, the variable resistor film 16 is formed of a metal oxide or a metal oxide nitride which is formed by oxidizing the material that is used for the conductive thin film 14.

Although the present invention has been described in terms of the preferred embodiment, it will be appreciated that various modifications and alternations might be made by those skilled in the art without departing from the spirit and scope of the invention. The invention should therefore be measured in terms of the claims which follow.

What is claimed is:

1. A method for manufacturing a variable resistive element, the variable resistive element having a first electrode, a second electrode and a variable resistor sandwiched between the first electrode and the second electrode, in which an electrical resistance between the first electrode and the second electrode changes when a voltage pulse is applied between the first electrode and the second electrode, the method comprising steps of:

depositing one conductive film as a precursor of the first electrode, the second electrode and the variable resistor; and converting a portion of the conductive film to the variable resistor so that remaining portion of the conductive film is divided into the first electrode and the second electrode by the variable resistor.

2. The method for manufacturing a variable resistive element according to claim 1 comprising steps of:

depositing the conductive film on a semiconductor substrate;

oxidizing the conductive film to convert a portion of the conductive film to the variable resistor; and depositing a protective interlayer insulating film over an entire surface after oxidizing the conductive film.

3. The method for manufacturing a variable resistive element according to claim 2 further comprising, after depositing the conductive film and before oxidizing the conductive film, steps of:

depositing a first interlayer insulating film so that an upper surface of the conductive film is covered; and creating an opening in a portion of the first interlayer insulating film so that a portion of an upper surface of the conductive film is exposed after depositing the first interlayer insulating film, wherein a peripheral region of the conductive film exposed via the opening is oxidized through the step of oxidizing the conductive film.

4. The method for manufacturing a variable resistive element according to claim 3 further comprising a step of reducing a thickness of the conductive film located at a bottom of the opening by partially removing an exposed portion of the conductive film exposed via the opening, after creating the opening and before oxidizing the conductive film.

5. The method for manufacturing a variable resistive element according to claim 2 further comprising steps of depositing a first interlayer insulating film on the semiconductor substrate and creating at least two separate openings in a predetermined region of the first interlayer insulating film, before depositing the conductive film; and reducing a thickness of the conductive film so that the conductive film deposited in a region other than the openings is not completely removed after depositing the conductive film and before oxidizing the conductive film, wherein the step of depositing the conductive film is carried out so that the two openings are completely filled with the conductive film, and the step of oxidizing the conductive film is a step of forming the variable resistor by oxidizing the conductive film by a thickness which is not less than a thickness of the conductive film deposited in the region other than the openings and which is less than the thickness of the conductive film deposited from an upper surface of the conductive film to a bottom of the openings.

6. The method for manufacturing a variable resistive element according to claim 2 further comprising carrying out a predetermined conductive film pre-depositing process on a layer under the conductive film in advance before depositing the conductive film so that the conductive film deposited in the step of depositing the conductive film has a locally thin film region having a film thickness smaller than that of other portion.

7. The method for manufacturing a variable resistive element according to claim 6, wherein the step of carrying out the conductive film pre-depositing process includes steps of: depositing a first interlayer insulating film on the semiconductor substrate; and creating an opening in tapered form so that an area of the opening becomes smaller toward a lower direction in a predetermined region of the first interlayer insulating film, and the step of depositing the conductive film is carried out over an entire surface so that the opening is not completely filled with the conductive film and the locally thin film region is formed in at least a portion of a sidewall inside the opening, and the step of oxidizing the conductive film is a step of forming the variable resistor by oxidizing the conductive film from an exposed surface side, and forming the first electrode and the second electrode by oxidizing at least the locally thin film region to divide the conductive film into the conductive film formed on a bottom side of the opening and the conductive film formed in a region above the locally thin film region by the locally thin film region which is oxidized and converted into the variable resistor.

8. The method for manufacturing a variable resistive element according to claim 6, wherein the step of carrying out the conductive film pre-depositing process includes steps of depositing a first interlayer insulating film on the semiconductor substrate; creating an opening in a predetermined region of the first interlayer insulating film; and forming a sidewall insulating film having a width increasing toward a lower direction on a sidewall surface of the opening, and the step of depositing the conductive layer is carried out over an entire surface so that the opening is not completely filled with the conductive layer and the locally thin film region is formed in at least a portion of a sidewall outside the sidewall insulating film, and the step of oxidizing the conductive film is a step of forming the variable resistor by oxidizing the conductive film from an exposed surface side, and forming the first electrode and the second electrode by oxidizing at least the locally thin film region to divide the conductive film into the conductive film formed on a bottom side of the opening and the conductive film formed in a region above the locally thin film region by the locally thin film region which is oxidized and converted into the variable resistor.

9. The method for manufacturing a variable resistive element according to claim 6, wherein the step of carrying out a conductive film pre-depositing process includes a step of depositing a first interlayer insulating film on the semiconductor substrate, the first interlayer insulating film having a step portion where there is a difference in height between adjacent portions of an upper surface, and the step of depositing the conductive film is a step of forming the conductive film having the locally thin film region by depositing the conductive film over an entire surface including the step portion, the locally thin film region having a film thickness decreasing toward a corner portion which is a intersection between a sidewall portion and the lower upper surface, the sidewall portion connecting the higher upper surface and the lower upper surface constituting the step portion, and the step of oxidizing the conductive film is a step of forming the variable resistor by oxidizing the conductive film from an exposed surface side, and forming the first electrode and the second electrode by oxidizing at least the locally thin film region to divide the conductive film into the conductive film deposited on the higher upper surface and the conductive film deposited on the lower upper surface by the locally thin film region which is oxidized and converted into the variable resistor.

10. The method for manufacturing a variable resistive element according to claim 6, wherein the step of carrying out a conductive film pre-depositing process includes steps of: depositing a first interlayer insulating film having a film density becoming higher toward an upper layer; and patterning the first interlayer insulating film to form a step portion where there is a difference in height between adjacent portions of an upper surface by removing the first interlayer insulating film other than a predetermined region and to make a sidewall portion for connecting the higher upper surface and the lower upper surface constituting the step portion have a reverse tapered form where the first interlayer insulating film protrudes more to outside toward the upper layer, and the step of depositing the conductive film is a step of forming the conductive film having the locally thin film region in wedge form by depositing the conductive film over an entire surface including the step portion, the locally thin film region having a film thickness decreasing toward a corner portion where the sidewall portion and the lower upper surface intersect, and the step of oxidizing the conductive film is a step of forming the variable resistor by oxidizing the conductive film from an exposed surface side, and forming the first electrode and the second electrode by oxidizing at least the locally thin film region to divide the conductive film into the conductive film deposited on the higher upper surface and the conductive film deposited on the lower upper surface by the locally thin film region which is oxidized and converted into the variable resistor.

11. The method for manufacturing a variable resistive element according to claim 10, wherein the step of depositing the first interlayer insulating film is carried out by increasing a temperature of the substrate continuously or intermittently.

12. The method for manufacturing a variable resistive element according to claim 10, wherein the step of patterning the first interlayer insulating film is carried out through wet etching.

13. The method for manufacturing a variable resistive element according to claim 6, wherein the step of carrying out the conductive film pre-depositing process includes steps of: depositing a first interlayer insulating film on the semiconductor substrate; depositing a second interlayer insulating film having an etching rate lower than that of the first interlayer insulating film on an upper surface of the first interlayer insulating film; and patterning the first and second interlayer insulating films to form a step portion where there is a difference in height between adjacent portions of an upper surface by removing the first and second interlayer insulating films other than a predetermined region and to make a sidewall portion for connecting the higher upper surface and the lower upper surface constituting the step portion have a reverse step form where a region formed of the second interlayer insulating film protrudes more to outside than a region formed of the first interlayer insulating film, the step of depositing the conductive film is a step of forming the conductive film having the locally thin film region in wedge form by depositing the conductive film over an entire surface including the step portion, the locally thin film region having a film thickness decreasing toward a corner portion where the sidewall portion and the lower upper surface intersect, and the step of oxidizing the conductive film is a step of forming the variable resistor by oxidizing the conductive film from an exposed surface side, and forming the first electrode and the second electrode by oxidizing at least the locally thin film region to divide the conductive film into the conductive film deposited on the higher upper surface and the conductive film deposited on the lower upper surface by the locally thin film region which is oxidized and converted into the variable resistor.

14. The method for manufacturing a variable resistive element according to claim 13, wherein the step of depositing the first interlayer insulating film is a step of depositing an $SiO_2$ film, the step of depositing the second interlayer insulating film is a step of depositing an SiN film, and the step of patterning the first and second interlayer insulating films is carried out through wet etching using an HF chemical.

15. The method for manufacturing a variable resistive element according to claim 6 further comprising steps of:

depositing an oxidation preventing insulating film so that an upper surface of the variable resistor is covered after oxidizing the conductive film, and patterning the oxidation preventing insulating film, the variable resistor and the conductive film after depositing the oxidation preventing insulating film.

16. The method for manufacturing a variable resistive element according to claim 15, wherein the oxidation preventing insulating film is an insulating film which includes nitrogen or carbon.

17. The method for manufacturing a variable resistive element according to claim 6, wherein the step of depositing the conductive film is carried out by using a directional sputtering film formation method.

18. The method for manufacturing a variable resistive element according to claim 6, wherein the step of depositing the conductive film is carried out by layering films formed by a CVD method and formed by sputtering.

19. The method for manufacturing a variable resistive element according to claim 1, wherein the conductive film is titanium nitride.

* * * * *